(12) United States Patent
Kanamori et al.

(10) Patent No.: US 11,729,976 B2
(45) Date of Patent: *Aug. 15, 2023

(54) SEMICONDUCTOR DEVICES INCLUDING UPPER AND LOWER SELECTORS

(71) Applicant: Samsung Electronics Co., Ltd., Suwon-si (KR)

(72) Inventors: Kohji Kanamori, Seongnam-si (KR); Yong Seok Kim, Suwon-si (KR); Kyung Hwan Lee, Hwaseong-si (KR); Jun Hee Lim, Seoul (KR); Jee Hoon Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 169 days.

This patent is subject to a terminal disclaimer.

(21) Appl. No.: 17/370,628

(22) Filed: Jul. 8, 2021

(65) Prior Publication Data

US 2021/0335819 A1    Oct. 28, 2021

Related U.S. Application Data

(63) Continuation of application No. 16/527,506, filed on Jul. 31, 2019, now Pat. No. 11,088,163.

(30) Foreign Application Priority Data

Mar. 19, 2019    (KR) .................... 10-2019-0030843

(51) Int. Cl.
*H10B 43/27*    (2023.01)
*H01L 23/528*   (2006.01)
(Continued)

(52) U.S. Cl.
CPC ......... *H10B 43/27* (2023.02); *G11C 16/0483* (2013.01); *G11C 16/08* (2013.01);
(Continued)

(58) Field of Classification Search
CPC .... H10B 43/27; H10B 43/40; G11C 16/0483; G11C 16/08; H01L 23/528; H01L 25/18;
(Continued)

(56) References Cited

U.S. PATENT DOCUMENTS

| | | |
|---|---|---|
| 8,476,708 B2 | 7/2013 | Fukuzumi et al. |
| 8,513,731 B2 | 8/2013 | Lee et al. |
| 8,891,306 B2 | 11/2014 | Aritome |
| 9,122,568 B2 | 9/2015 | Aritome |

(Continued)

FOREIGN PATENT DOCUMENTS

KR    10-2019-0018594 A    2/2019

OTHER PUBLICATIONS

Korean Notice of Allowance dated Jan. 12, 2023 issued in corresponding Korean Appln. No. 10-2019-0030843.

*Primary Examiner* — Lex H Malsawma
(74) *Attorney, Agent, or Firm* — Harness, Dickey & Pierce, P.L.C.

(57) ABSTRACT

A semiconductor device includes a lower stack structure that includes a lower word line, an upper stack structure that is on the lower stack structure and includes an upper word line, a decoder that is adjacent to the lower stack structure and the upper stack structure, a signal interconnection that is connected to the decoder, a lower selector that is connected to the signal interconnection and further connected to the lower word line, and an upper selector that is connected to the signal interconnection, isolated from direct contact with the lower selector, and further connected to the upper word line.

20 Claims, 12 Drawing Sheets

(51) Int. Cl.
  *H01L 25/18*   (2023.01)
  *H01L 25/00*   (2006.01)
  *G11C 16/08*   (2006.01)
  *H01L 29/78*   (2006.01)
  *H01L 29/10*   (2006.01)
  *G11C 16/04*   (2006.01)
  *H10B 43/40*   (2023.01)

(52) U.S. Cl.
  CPC ............ *H01L 23/528* (2013.01); *H01L 25/18* (2013.01); *H01L 25/50* (2013.01); *H01L 29/1037* (2013.01); *H01L 29/7827* (2013.01); *H10B 43/40* (2023.02)

(58) Field of Classification Search
  CPC .. H01L 25/50; H01L 29/1037; H01L 29/7827
  See application file for complete search history.

(56) References Cited

U.S. PATENT DOCUMENTS

| | | |
|---|---|---|
| 9,595,535 B1 | 3/2017 | Ogawa et al. |
| 9,659,950 B2 | 5/2017 | Yip et al. |
| 9,691,782 B1 | 6/2017 | Hwang et al. |
| 9,960,181 B1 | 5/2018 | Cui et al. |
| 10,074,667 B1 | 9/2018 | Higashi et al. |
| 10,734,371 B2 | 8/2020 | Park |
| 10,770,470 B2 | 9/2020 | Tanzawa et al. |
| 11,088,163 B2 * | 8/2021 | Kanamori ........... H01L 29/7827 |
| 2014/0189257 A1 | 7/2014 | Aritome |
| 2014/0189258 A1 | 7/2014 | Aritome |
| 2016/0027793 A1 | 1/2016 | Yip et al. |
| 2016/0079164 A1 | 3/2016 | Fukuzumi et al. |
| 2017/0236746 A1 | 8/2017 | Yu et al. |
| 2017/0352678 A1 | 12/2017 | Lu et al. |
| 2018/0247953 A1 | 8/2018 | Lee |
| 2018/0261623 A1 | 9/2018 | Higashi et al. |
| 2018/0374867 A1 | 12/2018 | Yun et al. |
| 2019/0312051 A1 | 10/2019 | Park et al. |

* cited by examiner

SEMICONDUCTOR DEVICES INCLUDING UPPER AND LOWER SELECTORS

CROSS-REFERENCE TO RELATED APPLICATIONS

This U.S. non-provisional patent application is a continuation of U.S. application Ser. No. 16/527,506, filed Jul. 31, 2019, and claims priority under 35 U.S.C. § 119 to Korean Patent Application No. 10-2019-0030843, filed on Mar. 19, 2019, in the Korean Intellectual Property Office (KIPO), the disclosure of each of which is incorporated herein by reference in its entirety.

BACKGROUND

1. Field

Devices and methods consistent with example embodiments relate to semiconductor devices having one or more selectors and methods of forming the semiconductor devices.

2. Description of Related Art

With an increase in the integration density of semiconductor devices, techniques of vertically forming a plurality of stack structures have been attempted. The number ("quantity") of address signal interconnections has gradually increased. An increase in the number of interconnections makes it difficult to increase integration density. A technique of connecting two components to one interconnection causes an increase in unnecessary power consumption.

SUMMARY

Some example embodiments of the inventive concepts are directed to providing semiconductor devices, which are advantageous for high integration intensity and exhibit low power consumption, and methods of forming the semiconductor devices.

According to some example embodiments, a semiconductor device may include a lower stack structure including an alternating stack of a plurality of lower word lines and a plurality of lower insulating layers, a plurality of lower channel structures configured to extend through the lower stack structure, an upper stack structure on the lower stack structure, the upper stack structure including an alternating stack of a plurality of upper word lines and a plurality of upper insulating layers, a plurality of upper channel structures isolated from direct contact with the plurality of lower channel structures, the plurality of upper channel structures configured to extend through the upper stack structure, a decoder adjacent to the lower stack structure and the upper stack structure, a plurality of signal interconnections connected to the decoder, a plurality of lower selectors connected to the plurality of lower word lines, and a plurality of upper selectors connected to the plurality of upper word lines. Each signal interconnection of the plurality of signal interconnections may be connected to a separate, respective lower selector of the plurality of lower selectors, and a separate, respective upper selector of the plurality of upper selectors.

According to some example embodiments, a semiconductor device may include a lower stack structure including an alternating stack of a plurality of lower word lines and a plurality of lower insulating layers, a plurality of lower channel structures configured to extend through the lower stack structure, an upper stack structure on the lower stack structure, the upper stack structure including an alternating stack of a plurality of upper word lines and a plurality of upper insulating layers, a plurality of upper channel structures isolated from direct contact with the plurality of lower channel structures, the plurality of upper channel structures configured to extend through the upper stack structure, a decoder adjacent to the lower stack structure and the upper stack structure, a signal interconnection connected to the decoder, a lower selector connected to the signal interconnection and further connected to one lower word line of the plurality of lower word lines, and an upper selector isolated from direct contact with the lower selector, connected to the signal interconnection, and further connected to one upper word line of the plurality of upper word lines.

According to some example embodiments, a semiconductor device may include a lower stack structure including a lower word line, an upper stack structure on the lower stack structure, the upper stack structure including an upper word line, a decoder adjacent to the lower stack structure and the upper stack structure, a signal interconnection connected to the decoder, a lower selector connected to the signal interconnection and connected to the lower word line, and an upper selector connected to the signal interconnection, isolated from direct contact with the lower selector, and further connected to the upper word line.

DETAILED DESCRIPTION OF EXAMPLE EMBODIMENTS

Figure 1:
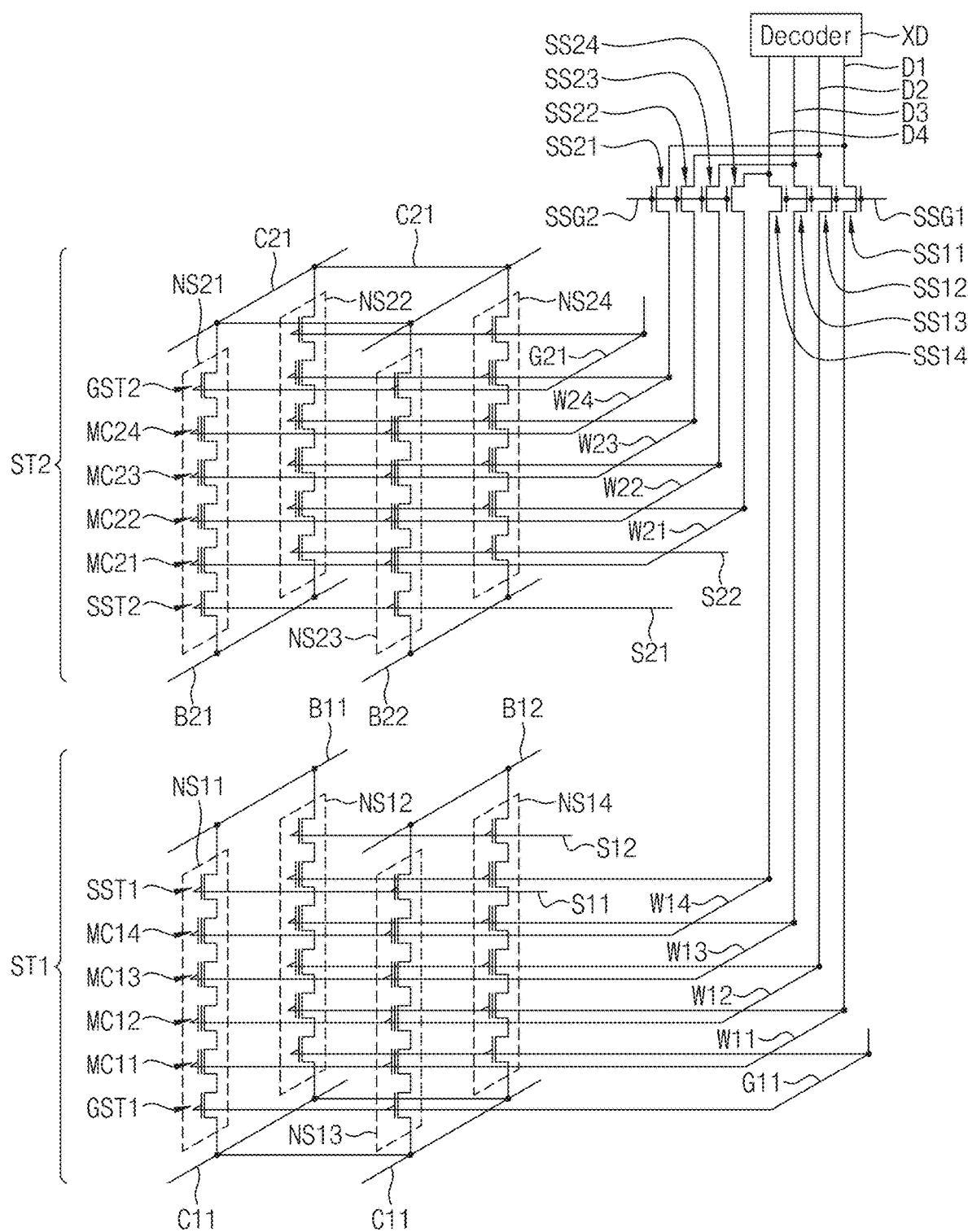
FIG. 1 is a circuit diagram of a semiconductor device according to some example embodiments.

FIG. 1 is a circuit diagram of a semiconductor device according to some example embodiments. The semiconductor device according to some example embodiments may include a non-volatile memory such as VNAND or three-dimensional (3D) flash memory.

Referring to FIG. 1, the semiconductor device according to some example embodiments may include a lower stack structure ST1, a plurality of lower bit lines B11 and B12, a plurality of upper bit lines B21 and B22, an upper stack structure ST2, a plurality of lower selectors SS11, SS12, SS13, and SS14, a plurality of upper selectors SS21, SS22, SS23, and SS24, and a decoder XD. In some example embodiments, the decoder XD may correspond to an address decoder or an X-decoder.

The lower stack structure ST1 may include a lower source line C11 and a plurality of lower strings NS11, NS12, NS13, and NS14. Each of the plurality of lower strings NS11, NS12, NS13, and NS14 may include a lower ground selection transistor GST1, a plurality of lower memory cells MC11, MC12, MC13, and MC14, and a lower string selection transistor SST1. The lower ground selection transistor GST1 may be connected to a lower ground selection line G11. Each of the plurality of lower memory cells MC11, MC12, MC13, and MC14 may be connected to a corresponding one of a plurality of lower word lines W11, W12, W13, and W14. The lower string selection transistor SST1 may be connected to a corresponding one of a plurality of lower string selection lines S11 and S12.

The upper stack structure ST2 may include an upper source line C21 and a plurality of upper strings NS21, NS22, NS23, and NS24. Each of the plurality of upper strings NS21, NS22, NS23, and NS24 may include an upper ground selection transistor GST2, a plurality of upper memory cells MC21, MC22, MC23, and MC24, and an upper string selection transistor SST2. The upper ground selection transistor GST2 may be connected to an upper ground selection line G21. Each of the plurality of upper memory cells MC21, MC22, MC23, and MC24 may be connected to a corresponding one of a plurality of upper word lines W21, W22, W23, and W24. The upper string selection transistor SST2 may be connected to a corresponding one of a plurality of upper string selection lines S21 and S22.

Each of the plurality of lower selectors SS11, SS12, SS13, and SS14 may be connected to a corresponding one of a plurality of signal interconnections D1, D2, D3, and D4. Each of the plurality of lower selectors SS11, SS12, SS13, and SS14 may be connected to a corresponding one of the plurality of lower word lines W11, W12, W13, and W14. The plurality of lower selectors SS11, SS12, SS13, and SS14 may include a lower selection line SSG1. Each of the plurality of upper selectors SS21, SS22, SS23, and SS24 may be connected to a corresponding one of the plurality of signal interconnections D1, D2, D3, and D4. Each of the plurality of upper selectors SS21, SS22, SS23, and SS24 may be connected to a corresponding, respective one of the plurality of upper word lines W24, W23, W22, and W21. The plurality of upper selectors SS21, SS22, SS23, and SS24 may include an upper selection line SSG2.

Figure 2:
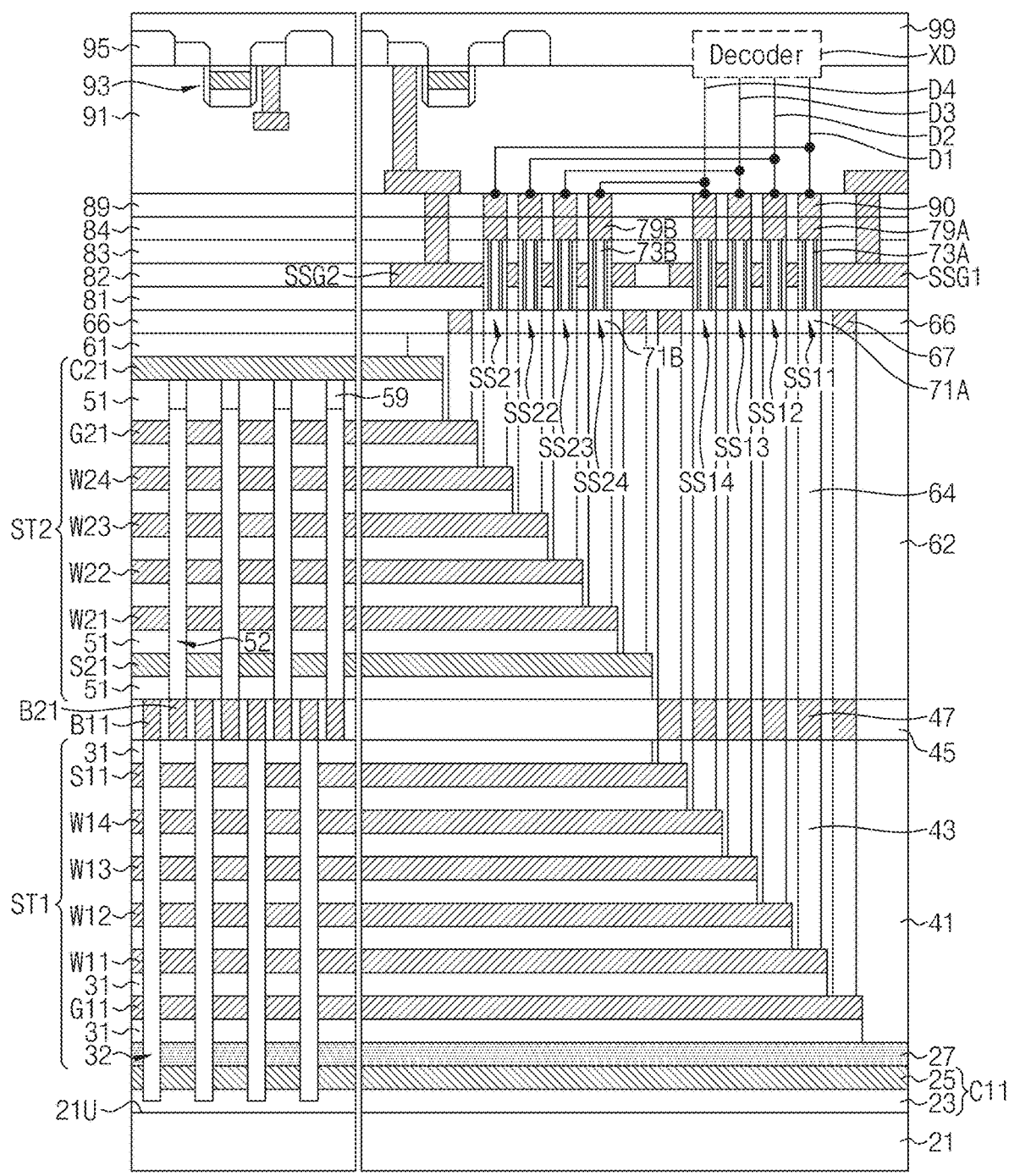
FIG. 2 is a cross-sectional view illustrating a semiconductor device according to some example embodiments.

FIG. 2 is a cross-sectional view illustrating a semiconductor device according to some example embodiments.

Referring to FIG. 2, the semiconductor device according to some example embodiments may include a first substrate 21, a buried conductive layer 23, a replacement conductive line 25, a support 27, a plurality of lower insulating layers 31, a lower ground selection line G11, a plurality of lower word lines W11, W12, W13, and W14, a lower string selection line S11, a plurality of lower channel structures 32, a plurality of lower bit lines B11, a first insulating layer 41, a plurality of lower contact plugs 43, a second insulating layer 45, a plurality of middle pads 47, a plurality of upper bit lines B21, a plurality of upper insulating layers 51, an upper string selection line S21, a plurality of upper word lines W21, W22, W23, and W24, an upper ground selection line G21, a plurality of upper channel structures 52, an upper source line C21, a third insulating layer 61, a fourth insulating layer 62, a plurality of upper contact plugs 64, a fifth insulating layer 66, a plurality of upper pads 67, a plurality of first electrodes 71A, a plurality of lower selection channel structures 73A, a plurality of second electrodes 79A, a plurality of third electrodes 71B, a plurality of upper selection channel structures 73B, a plurality of fourth electrodes 79B, a lower selection line SSG1, an upper selection line SSG2, a sixth insulating layer 81, a seventh insulating layer 82, an eighth insulating layer 83, a ninth insulating layer 84, a tenth insulating layer 89, a plurality of bonding pads 90, an eleventh insulating layer 91, a plurality of signal interconnections D1, D2, D3, and D4, a decoder XD, a plurality of transistors 93, a device isolation layer 95, and a second substrate 99.

Each of the plurality of upper channel structures 52 may include an upper source pad 59. The buried conductive layer 23 and the replacement conductive line 25 may at least partially comprise a lower source line C11. The plurality of first electrodes 71A, the plurality of lower selection channel structures 73A, the plurality of second electrodes 79A, and the lower selection line SSG1 may at least partially comprise a plurality of lower selectors SS11, SS12, SS13, and SS14. The plurality of third electrodes 71B, the plurality of upper selection channel structures 73B, the plurality of fourth electrodes 79B, and the upper selection line SSG2 may at least partially comprise a plurality of upper selectors SS21, SS22, SS23, and SS24.

In some example embodiments, the lower stack structure ST1 may include the buried conductive layer 23, the replacement conductive line 25, the support 27, the plurality of lower insulating layers 31, the lower ground selection line G11, the plurality of lower word lines W11, W12, W13, and W14, and the lower string selection line S11. As shown in FIG. 2, in some example embodiments the lower stack structure ST1 may include a plurality of lower word lines W11, W12, W13, and W14 and a plurality of lower insulating layers 31, where the plurality of lower word lines W11, W12, W13, and W14 and the plurality of lower insulating layers 31 are alternately stacked, such that it will be understood that, as shown in FIG. 2, the lower stack structure ST1 may include an alternating stack of a plurality of lower word lines W11, W12, W13, and W14 and a plurality of lower insulating layers 31, such that adjacent lower word lines are interposed by a lower insulating layer 31, and adjacent lower insulating layers 31 are interposed by a lower word line. As shown in FIG. 2, the upper stack structure ST2 may be on the lower stack structure ST1. The upper stack structure ST2 may include the plurality of upper insulating layers 51, the upper string selection line S21, the plurality of upper word lines W21, W22, W23, and W24, the upper ground selection line G21, the plurality of upper channel structures 52, and the upper source line C21. As shown in FIG. 2, in some example embodiments the upper stack structure ST2 may include a plurality of upper word lines W21, W22, W23, and W24 and a plurality of upper insulating layers 51, where the plurality of upper word lines W21, W22, W23, and W24 and the plurality of upper insulating layers 51 are alternately stacked, such that it will be understood that, as shown in FIG. 2, the upper stack structure ST2 may include an alternating stack of a plurality of upper word lines W21, W22, W23, and W24 and a plurality of upper insulating layers 51, such that adjacent upper word lines are interposed by an upper insulating layer 51, and adjacent upper insulating layers 51 are interposed by an upper word line.

It will be understood that an element that is "on" another element may be above or below the other element. It will be further understood that an element that is "on" another element may be "directly" on the other element, such that the elements are in direct contact with each other, or may be "indirectly" on the other element, such that the elements are isolated from direct contact with each other by one or more interposing spaces and/or structures.

FIGS. 3, 4, 5, and 6 are enlarged views of a portion of FIG. 2 according to some example embodiments.

Figure 3:
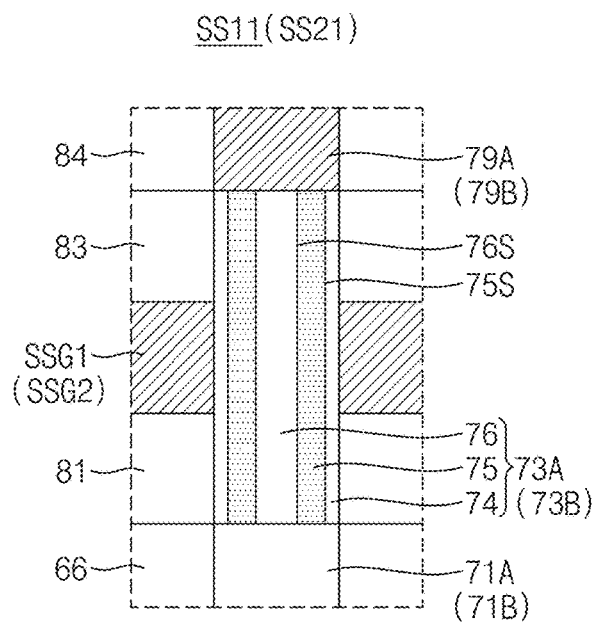
FIGS. 3, 4, 5, and 6 are enlarged views of a portion of FIG. 2 according to some example embodiments.

Referring to FIG. 3, a first lower selector SS11 may include a lower selection channel structure 73A disposed between a first electrode 71A and a second electrode 79A. In some example embodiments, each selection channel structure of the plurality of lower selection channel structures 73A and the plurality of upper selection channel structures 73B may include the structure of the lower selection channel structure 73A shown in FIG. 3. The lower selection channel structure 73A may pass through a lower selection line SSG1. The lower selection channel structure 73A may include a gate dielectric layer 74, a channel layer 75, and a core layer 76. The channel layer 75 may partially or entirely surround the outside of the core layer 76 (e.g., entirely surround an outer longitudinal surface 76S of the core layer 76 as shown in FIG. 3). The gate dielectric layer 74 may partially or entirely surround the outside of the channel layer 75 (e.g., entirely surround an outer longitudinal surface 75S of the channel layer 75 as shown in FIG. 3). The gate dielectric layer 74 may be interposed between the lower selection line SSG1 and the channel layer 75. As shown in FIG. 3, the channel layer 75 may be connected to the plurality of first electrodes 71A and the plurality of second electrodes 79A (e.g., in a lower selection channel structure 73A), or the channel layer 75 may be connected to the plurality of third electrodes 71B and the plurality of fourth electrodes 79B (e.g., in an upper selection channel structure 73B).

The gate dielectric layer 74 may include silicon oxide, a high-k dielectric, or a combination thereof. The channel layer 75 may include a semiconductor layer including polysilicon, amorphous silicon, single-crystalline silicon, or a combination thereof. The channel layer 75 may include P-type impurities. In some example embodiments, semiconductor layers having N-type impurities may be formed in both ends of the channel layer 75. The core layer 76 may include silicon oxide, silicon nitride, silicon oxynitride, a low-k dielectric, a high-k dielectric, polysilicon, or a combination thereof.

Each of the gate dielectric layer 74, the channel layer 75, and the core layer 76 may be in direct contact with the first electrode 71A and the second electrode 79A. Each of the first electrode 71A and the second electrode 79A may include a conductive layer including a metal, a metal nitride, a metal oxide, a metal silicide, conductive carbon, polysilicon, or a combination thereof. In some example embodiments, each of the first electrode 71A and the second electrode 79A may include a polysilicon layer containing N-type impurities. Each of the first electrode 71A and the second electrode 79A may serve as a source or drain. The lower selection line SSG1 may serve as a gate electrode. The lower selection line SSG1, the lower selection channel structure 73A, the first electrode 71A, and the second electrode 79A may at least partially comprise a transistor. Each of the plurality of lower selectors SS11, SS12, SS13, and SS14 may include substantially the same configuration as the first lower selector SS11.

A first upper selector SS21 may include an upper selection channel structure 73B disposed between a third electrode 71B and a fourth electrode 79B. The upper selection channel structure 73B may pass through an upper selection line SSG2. The upper selection channel structure 73B may include substantially the same configuration as the lower selection channel structure 73A. Each of the gate dielectric layer 74, the channel layer 75, and the core layer 76 may be in direct contact with the third electrode 71B and the fourth electrode 79B. Each of the third electrode 71B and the fourth electrode 79B may include substantially the same configuration as the first electrode 71A or the second electrode 79A. Each of the third electrode 71B and the fourth electrode 79B may serve as a source or drain. The upper selection line SSG2 may serve as a gate electrode. Each of the plurality of upper selectors SS21, SS22, SS23, and SS24 may include substantially the same configuration as the first upper selector SS21.

Figure 4:
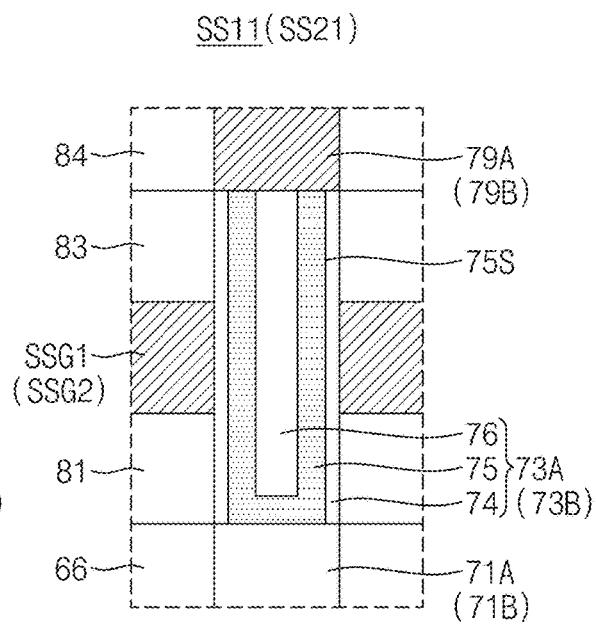

Referring to FIG. 4, a channel layer 75 may surround one end of a core layer 76. In some example embodiments, each selection channel structure of the plurality of lower selection channel structures 73A and the plurality of upper selection channel structures 73B may include the structure of the lower selection channel structure 73A shown in FIG. 4.

A first electrode 71A or a third electrode 71B may be in direct contact with a gate dielectric layer 74 and the channel layer 75. As shown in FIG. 4, the channel layer 75 may be connected to the plurality of first electrodes 71A and the plurality of second electrodes 79A (e.g., in a lower selection channel structure 73A), or the channel layer 75 may be connected to the plurality of third electrodes 71B and the plurality of fourth electrodes 79B (e.g., in an upper selection channel structure 73B).

Figure 5:
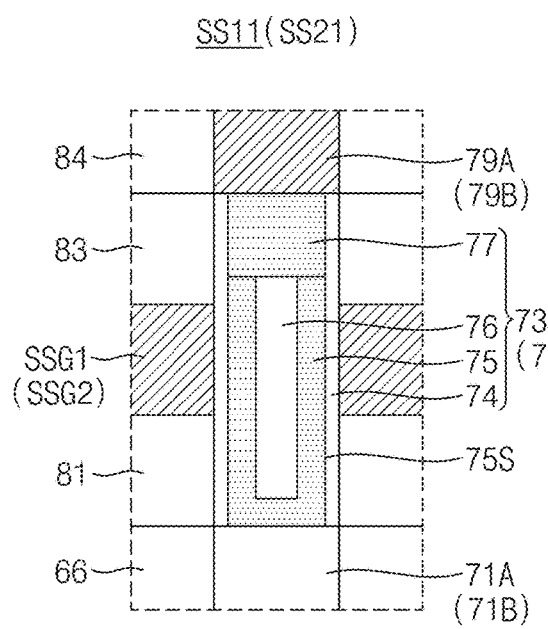

Referring to FIG. 5, a lower selection channel structure 73A (and/or upper selection channel structure 73B) may include a gate dielectric layer 74, a channel layer 75, a core layer 76, and a selection pad 77. The selection pad 77 may be disposed between the channel layer 75 and a second electrode 79A and thus the plurality of second electrodes 79A (when included in a lower selection channel structure 73A) or between the channel layer 75 and a fourth electrode 79B and thus the plurality of fourth electrodes 79B (when included in an upper selection channel structure 73B). The selection pad 77 may include a polysilicon layer containing N-type impurities. The selection pad 77 may serve as a source or drain. An upper selection channel structure 73B may include substantially the same configuration as the lower selection channel structure 73A. In some example embodiments, each selection channel structure of the plurality of lower selection channel structures 73A and the plurality of upper selection channel structures 73B may include the structure of the lower selection channel structure 73A shown in FIG. 5.

Figure 6:
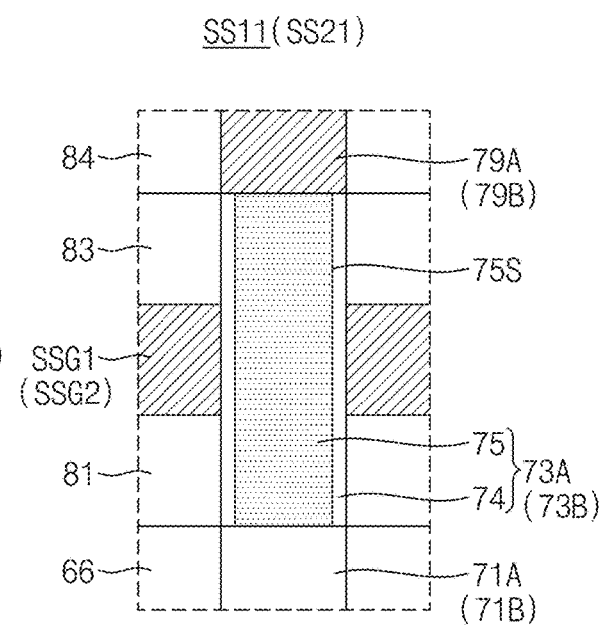

Referring to FIG. 6, a lower selection channel structure 73A (and/or upper selection channel structure 73B) may include a channel layer 75 and a gate dielectric layer 74 configured to partially or entirely surround the outside of the channel layer 75 (e.g., entirely surround an outer longitudinal surface 75S of the channel layer 75 as shown in FIG. 6). In some example embodiments, each selection channel structure of the plurality of lower selection channel structures 73A and the plurality of upper selection channel structures 73B may include the structure of the lower selection channel structure 73A shown in FIG. 6. As shown in FIG. 6, the channel layer 75 may be connected to the plurality of first electrodes 71A and the plurality of second electrodes 79A (e.g., in a lower selection channel structure 73A), or the channel layer 75 may be connected to the plurality of third electrodes 71B and the plurality of fourth electrodes 79B (e.g., in an upper selection channel structure 73B).

Figure 7:
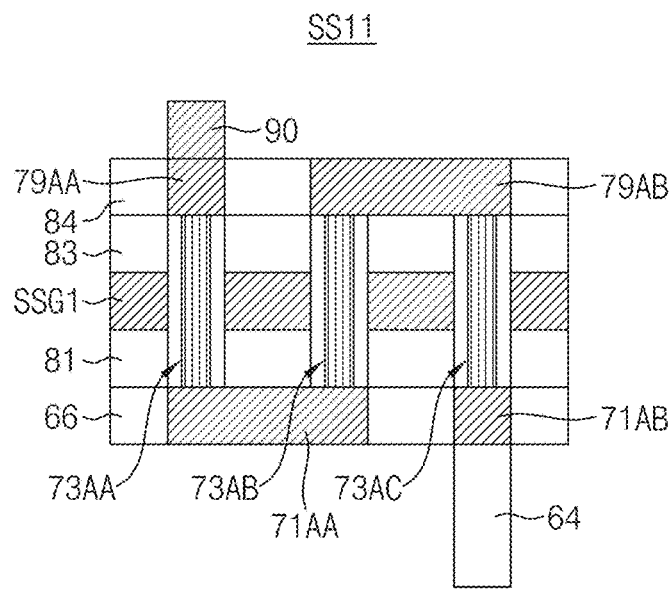
FIGS. 7, 8, and 9 are cross-sectional views illustrating some components of a semiconductor device according to some example embodiments.
Figure 8:
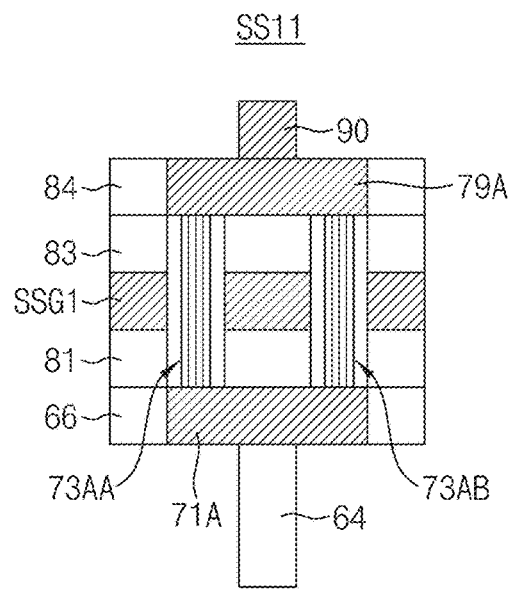
Figure 9:
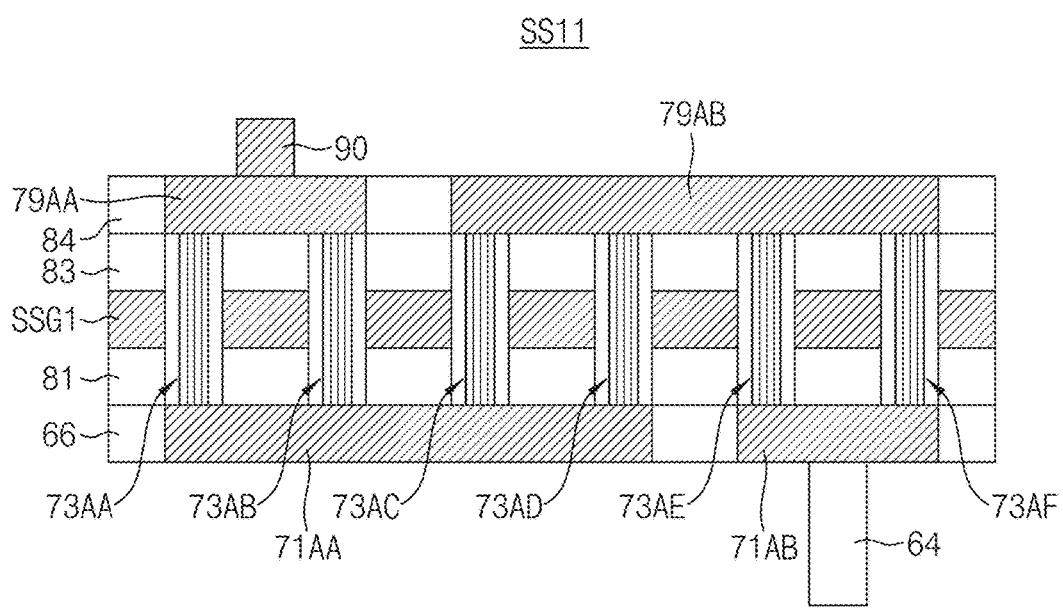

FIGS. 7, 8, and 9 are cross-sectional views illustrating some components of a semiconductor device according to some example embodiments.

Referring to FIG. 7, a first lower selector SS11 may include a plurality of first electrodes 71AA and 71AB, a plurality of lower selection channel structures 73AA, 73AB, and 73AC, and a plurality of second electrodes 79AA and 79AB. Each of the plurality of lower selection channel structures 73AA, 73AB, and 73AC may pass through a lower selection line SSG1. The plurality of first electrodes 71AA and 71AB, the plurality of lower selection channel structures 73AA, 73AB, and 73AC, the plurality of second electrodes 79AA and 79AB, and the lower selection line SSG1 may at least partially comprise a plurality of vertical transistors. The first lower selector SS11 may include a plurality of vertical transistors, which are connected in series.

Each of the plurality of lower selectors SS11, SS12, SS13, and SS14 and the plurality of upper selectors SS21, SS22, SS23, and SS24 may include a configuration that is substantially the same as or similar to that of the first lower selector SS11. Accordingly, it will be understood that each selector of the plurality of lower selectors SS11, SS12, SS13, and SS14 and the plurality of upper selectors SS21, SS22, SS23, and SS24 may include one or more transistors.

Referring to FIG. 8, a first lower selector SS11 may include a first electrode 71A, a plurality of lower selection channel structures 73AA and 73AB, and a second electrode 79A. Each of the plurality of lower selection channel structures 73AA and 73AB may pass through a lower selection line SSG1. The first lower selector SS11 may include a plurality of vertical transistors, which are connected in parallel. Each of the plurality of lower selectors SS11, SS12, SS13, and SS14 and the plurality of upper selectors SS21, SS22, SS23, and SS24 may include a configuration that is substantially the same as or similar to that of the first lower selector SS11. Accordingly, it will be understood that each selector of the plurality of lower selectors SS11, SS12, SS13, and SS14 and the plurality of upper selectors SS21, SS22, SS23, and SS24 may include one or more transistors. Furthermore, as shown in at least FIG. 8, each selector may include a plurality of vertical transistors, and at least one pair of vertical transistors of the plurality of vertical transistors may be connected in parallel.

Referring to FIG. 9, a first lower selector SS11 may include a plurality of first electrodes 71AA and 71AB, a plurality of lower selection channel structures 73AA, 73AB, 73AC, 73AD, 73AE, and 73AF, and a plurality of second electrodes 79AA and 79AB. Each of the plurality of lower selection channel structures 73AA, 73AB, 73AC, 73AD, 73AE, and 73AF may pass through a lower selection line SSG1. Each of the plurality of lower selectors SS11, SS12, SS13, and SS14 and the plurality of upper selectors SS21, SS22, SS23, and SS24 may include a configuration that is substantially the same as or similar to that of the first lower selector SS11.

FIGS. 10, 11, 12, 13, and 14 are enlarged views of a portion of FIG. 2 according to some example embodiments.

Figure 10:
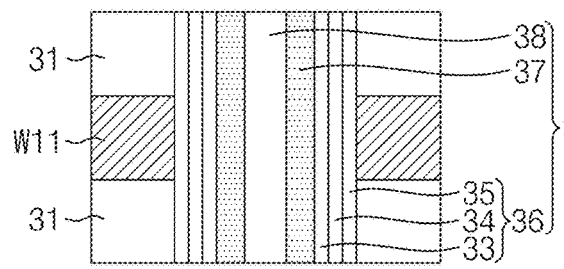
FIGS. 10, 11, 12, 13, and 14 are enlarged views of a portion of FIG. 2 according to some example embodiments.

Referring to FIG. 10, a lower channel structure 32 may pass through a first lower word line W11. The lower channel structure 32 may include a lower information storage pattern 36, a lower channel pattern 37, and a lower core pattern 38. The lower channel pattern 37 may surround the outside of the lower core pattern 38. The lower information storage pattern 36 may surround the outside of the lower channel pattern 37. The lower information storage pattern 36 may include a lower tunnel insulating layer 33 configured to surround the outside of the lower channel pattern 37, a lower charge storage layer 34 configured to surround the outside of the lower tunnel insulating layer 33, and a lower blocking layer 35 configured to surround the outside of the lower charge storage layer 34. The lower blocking layer 35 may be interposed between the lower charge storage layer 34 and the first lower word line W11.

The lower tunnel insulating layer 33 may include an insulating layer including silicon oxide. The lower charge storage layer 34 may include an insulating layer including silicon nitride. The lower blocking layer 35 may include an insulating layer including silicon oxide, silicon nitride, silicon oxynitride, a high-k dielectric, or a combination thereof. The lower channel pattern 37 may include a semiconductor layer including polysilicon, amorphous silicon, single-crystalline silicon, or a combination thereof. The lower channel pattern 37 may include P-type impurities. The lower core pattern 38 may include silicon oxide, silicon nitride, silicon oxynitride, a low-k dielectric, a high-k dielectric, polysilicon, or a combination thereof.

Figure 11:
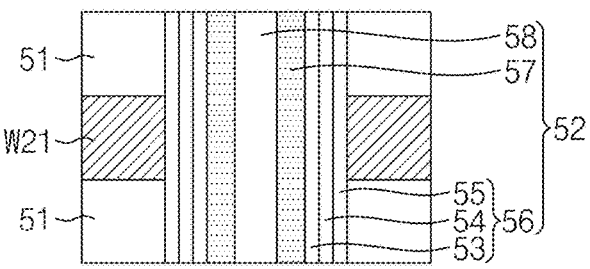

Referring to FIG. 11, an upper channel structure 52 may pass through a first upper word line W21. The upper channel structure 52 may include an upper information storage pattern 56, an upper channel pattern 57, and an upper core pattern 58. The upper channel pattern 57 may surround the outside of the upper core pattern 58. The upper information storage pattern 56 may surround the outside of the upper channel pattern 57. The upper information storage pattern 56 may include an upper tunnel insulating layer 53 configured to surround the outside of the upper channel pattern 57, an upper charge storage layer 54 configured to surround the outside of the upper tunnel insulating layer 53, and an upper blocking layer 55 configured to surround the outside of the upper charge storage layer 54. The upper blocking layer 55 may be interposed between the upper charge storage layer 54 and the first upper word line W21. The upper tunnel insulating layer 53, the upper charge storage layer 54, the upper blocking layer 55, the upper channel pattern 57, and the upper core pattern 58 may include materials similar to materials for the lower tunnel insulating layer 33, the lower charge storage layer 34, the lower blocking layer 35, the lower channel pattern 37, and the lower core pattern 38.

Figure 12:
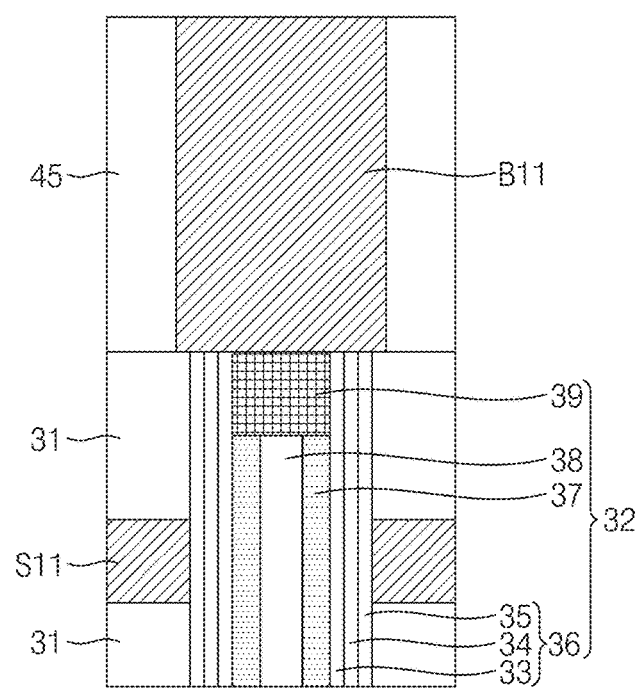

Referring to FIG. 12, a lower bit line B11 may be disposed on a lower channel structure 32. Restated, the plurality of lower bit lines B11 may be connected to separate, respective lower channel structures 32 of the plurality of lower channel structures 32. The lower channel structure 32 may pass through a lower string selection line S11. The lower channel structure 32 may include a lower information storage pattern 36, a lower channel pattern 37, a lower core pattern 38, and a lower bit pad 39. The lower bit pad 39 may be disposed between the lower channel pattern 37 and the lower bit line B11. The lower bit pad 39 may include a polysilicon layer containing N-type impurities. The lower bit pad 39 may serve as a source or drain.

Figure 13:
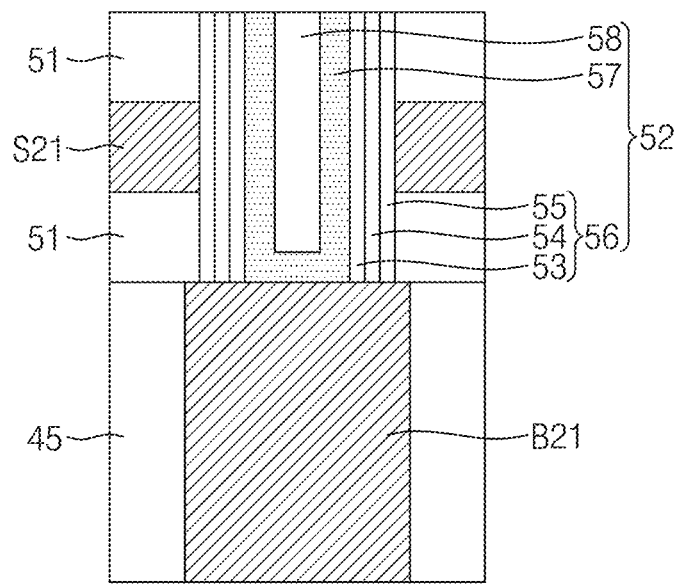

Referring to FIG. 13, an upper channel structure 52 may be disposed on an upper bit line B21. Restated, the plurality of upper bit lines B21 may be connected to separate, respective upper channel structures 52 of the plurality of upper channel structures 52. The upper channel structure 52 may pass through an upper string selection line S21.

Figure 14:
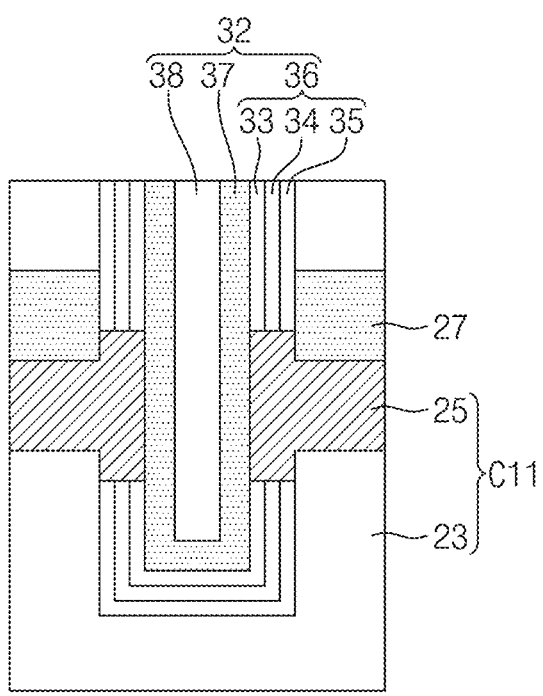

Referring to FIG. 14, a replacement conductive line 25 may pass through a lower information storage pattern 36 and be in direct contact with a side surface of a lower channel pattern 37. A buried conductive layer 23 and the replacement conductive line 25 may at least partially comprise a lower source line C11. The lower channel pattern 37 may be electrically connected to the lower source line C11.

Referring again to FIGS. 1 to 14, the lower stack structure ST1 may be disposed on the first substrate 21. The lower stack structure ST1 may include the plurality of lower insulating layers 31 and the plurality of lower word lines W11, W12, W13, and W14, which are alternately and repeatedly stacked. The lower ground selection line G11 may be disposed between the first substrate 21 and the plurality of lower word lines W11, W12, W13, and W14. The buried conductive layer 23, the replacement conductive line 25, and the support 27 may be sequentially stacked between the first substrate 21 and the lower ground selection line G11. The plurality of lower string selection lines S11 and S12 may be disposed on the plurality of lower word lines W11, W12, W13, and W14.

As shown in at least FIG. 2, the plurality of lower channel structures 32 may pass ("extend") through the lower stack structure ST1. Each of the plurality of lower channel structures 32 may vertically pass through the plurality of lower insulating layers 31, the plurality of lower string selection lines S11 and S12, the plurality of lower word lines W11, W12, W13, and W14, the lower ground selection line G11, the support 27, and the replacement conductive line 25 and penetrate into the buried conductive layer 23. Each of the plurality of lower channel structures 32 may include a configuration similar to those described with reference to FIGS. 2, 10, 12, and 14.

Edges of the lower ground selection line G11, the plurality of lower word lines W11, W12, W13, and W14, and the plurality of lower string selection lines S11 and S12 may be covered by the first insulating layer 41. Each of the plurality of lower contact plugs 43 may pass through the first insulating layer 41 and be in direct contact with a corresponding one of the lower ground selection line G11, the plurality of lower word lines W11, W12, W13, and W14, and the plurality of lower string selection lines S11 and S12.

The second insulating layer 45 may cover the lower stack structure ST1 and the first insulating layer 41. The plurality of lower bit lines B11 and B12, the plurality of upper bit lines B21 and B22, and the plurality of middle pads 47 may be disposed in the second insulating layer 45. For example, as shown in at least FIG. 2, the plurality of lower bit lines B11 and the plurality of upper bit lines B21 may be adjacent to each other between the lower stack structures ST1 and the upper stack structure ST2. The plurality of lower bit lines B11 and B12, the plurality of upper bit lines B21 and B22, and the plurality of middle pads 47 may be disposed at substantially the same level. As shown in at least FIG. 2, the plurality of upper bit lines B21 and B22 may be spaced apart from ("isolated from direct contact with") the plurality of lower bit lines B11 and B12. Each of the plurality of upper bit lines B21 and B22 may be disposed between the plurality of lower bit lines B11 and B12. The plurality of lower bit lines B11 and B12 may be in contact with upper ends of the plurality of lower channel structures 32. The plurality of middle pads 47 may be in contact with upper ends of the plurality of lower contact plugs 43.

The upper stack structure ST2 may be disposed on the second insulating layer 45. The upper stack structure ST2 may include the plurality of upper insulating layers 51 and the plurality of upper word lines W21, W22, W23, and W24, which are alternately and repeatedly stacked. The plurality of upper string selection lines S21 and S22 may be disposed between the second insulating layer 45 and the plurality of upper word lines W21, W22, W23, and W24. As shown in at least FIG. 2, the plurality of upper string selection lines S21 and S22 may be between the plurality of upper bit lines B21 and B22 and the plurality of upper word lines W21, W22, W23, and W24. As shown in at least FIG. 2, the upper ground selection line G21 may be disposed on the plurality of upper word lines W21, W22, W23, and W24. The upper source line C21 may be disposed on the upper ground selection line G21.

As shown in at least FIG. 2, the plurality of upper channel structures 52 may pass ("extend") through the upper stack structure ST2. The plurality of upper channel structures 52 may be spaced apart from ("isolated from direct contact with") the plurality of lower channel structures 32. Each of the plurality of upper channel structures 52 may vertically pass through the plurality of upper insulating layers 51, the upper ground selection line G21, the plurality of upper word lines W21, W22, W23, and W24, and the plurality of upper string selection lines S21 and S22 and be in contact with a corresponding one of the plurality of upper bit lines B21 and B22. Each of the plurality of upper channel structures 52 may include a configuration similar to those described with reference to FIGS. 2, 11, and 13. The upper source line C21 may be in contact with upper ends of the plurality of upper channel structures 52. The plurality of lower bit lines B11 and B12 and the plurality of upper bit lines B21 and B22 may be disposed adjacent to each other between the lower stack structure ST1 and the upper stack structure ST2.

The fourth insulating layer 62 may be disposed on the second insulating layer 45 and cover edges of the upper ground selection line G21, the plurality of upper word lines W21, W22, W23, and W24, and the plurality of upper string selection lines S21 and S22. Some of the plurality of upper contact plugs 64 may pass through the fourth insulating layer 62 and be in contact with the upper ground selection line G21, the plurality of upper word lines W21, W22, W23, and W24, and the plurality of upper string selection lines S21 and S22. Some others of the plurality of upper contact plugs 64 may pass through the fourth insulating layer 62 and be in contact with the plurality of middle pads 47.

The plurality of lower selectors SS11, SS12, SS13, and SS14 and the plurality of upper selectors SS21, SS22, SS23, and SS24 may be disposed on the upper stack structure ST2. Each of the plurality of lower selectors SS11, SS12, SS13, and SS14 and the plurality of upper selectors SS21, SS22, SS23, and SS24 may include a configuration similar to those described with reference to FIGS. 2 to 9.

For example, the plurality of lower selectors SS11, SS12, SS13, and SS14 may include the lower selection line SSG1, the plurality of lower selection channel structures 73A adjacent to the lower selection line SSG1 and configured to pass ("extend") through the lower selection line SSG1, the plurality of first electrodes 71A disposed between the plurality of lower selection channel structures 73A and the plurality of lower word lines W11, W12, W13, and W14, and the plurality of second electrodes 79A disposed between the plurality of lower selection channel structures 73A and the plurality of signal interconnections D1, D2, D3, and D4. The plurality of upper selectors SS21, SS22, SS23, and SS24 may include the upper selection line SSG2 spaced apart from ("isolated from direct contact with") the lower selection line SSG1, the plurality of upper selection channel structures 73B adjacent to the upper selection line SSG2 and configured to pass ("extend") through the upper selection line SSG2, the plurality of third electrodes 71B disposed between the plurality of upper selection channel structures 73B and the plurality of upper word lines W21, W22, W23, and W24, and the plurality of fourth electrodes 79B disposed between the plurality of upper selection channel structures 73B and the plurality of signal interconnections D1, D2, D3, and D4. The upper selection line SSG2 may be disposed at substantially the same level as the lower selection line SSG1. Restated, and as shown in FIGS. 1 to 14, the upper selection line SSG2 and the lower selection line SSG1 may be coplanar with each other, such that they both extend through a common plane that extends parallel to an upper surface 21U of the first substrate 21. Each lower selection channel structure of the plurality of lower selection channel structures 73A may extend through the lower selection line SSG1, and each upper selection channel structure of the plurality of upper selection channel structures 73B may extend through the upper selection line SSG2.

Each of the plurality of lower selectors SS11, SS12, SS13, and SS14 may be connected to a corresponding one of the plurality of lower word lines W11, W12, W13, and W14. For example, each of the plurality of lower selection channel structures 73A may be connected to a corresponding one of the plurality of lower word lines W11, W12, W13, and W14 via the plurality of first electrodes 71A, the plurality of upper contact plugs 64, the plurality of middle pads 47, and the plurality of lower contact plugs 43. Each of the plurality of upper selectors SS21, SS22, SS23, and SS24 may be connected to a corresponding one of the plurality of upper word lines W21, W22, W23, and W24. For example, each of the plurality of upper selection channel structures 73B may be connected to a corresponding one of the plurality of upper word lines W21, W22, W23, and W24 via the plurality of third electrodes 71B and the plurality of upper contact plugs 64.

As shown in FIGS. 1 to 14, the decoder XD may be adjacent to the lower stack structure ST1 and the upper stack structure ST2. The decoder XD may be disposed on the plurality of lower selectors SS11, SS12, SS13, and SS14 and the plurality of upper selectors SS21, SS22, SS23, and SS24. Each signal interconnection of the plurality of signal interconnections D1, D2, D3, and D4 may be in contact with the decoder XD, such that the plurality of signal interconnections D1, D2, D3, and D4 are connected to the decoder XD. Each signal interconnection of the plurality of signal interconnections D1, D2, D3, and D4 may be connected to a corresponding one of the plurality of lower selectors SS11, SS12, SS13, and SS14 and connected to a corresponding one of the plurality of upper selectors SS21, SS22, SS23, and SS24. Each lower selector of the plurality of lower selectors SS11, SS12, SS13, and SS14 may be connected to a separate word line of the plurality of lower word lines W11, W12, W13, and W14, such that the plurality of lower selectors SS11, SS12, SS13, and SS14 are connected to the plurality of lower word lines W11, W12, W13, and W14. Each signal interconnection of the plurality of signal interconnections D1, D2, D3, and D4 may be connected to a separate, respective lower selector of the plurality of lower selectors SS11, SS12, SS13, and SS14. Each signal interconnection of the plurality of signal interconnections D1, D2, D3, and D4 may be connected to a corresponding (e.g., "separate, respective") lower word line of the plurality of lower word lines W11, W12, W13, and W14 via a separate, respective lower selector of the plurality of lower selectors SS11, SS12, SS13, and SS14. Each upper selector of the plurality of upper selectors SS21, SS22, SS23, and SS24 may be connected to a separate word line of the plurality of upper word lines W21, W22, W23, and W24, such that the plurality of upper selectors SS21, SS22, SS23, and SS24 are connected to the plurality of upper word lines W21, W22, W23, and W24. Each signal interconnection of the plurality of signal interconnections D1, D2, D3, and D4 may be connected to a separate, respective upper selector of the plurality of upper selectors SS21, SS22, SS23, and SS24. Further, each signal interconnection of the plurality of signal interconnections D1, D2, D3, and D4 may be connected to a corresponding (e.g., separate, respective) upper word line of the plurality of upper word lines W21, W22, W23, and W24 via a separate, respective upper selector of the plurality of upper selectors SS21, SS22, SS23, and SS24. In some example embodiments, the semiconductor device may include a single signal interconnection D1 connected to the decoder XD, a single lower selector SS11 connected to the signal interconnection D1 and further connected to one lower word line W11 of the plurality of lower word lines W11, W12, W13, and W14, and a single upper selector SS21 isolated from direct contact with the single lower selector SS11, connected to the single signal interconnection D1, and further connected to one upper word line W24 of the plurality of upper word lines W21, W22, W23, and W24. In some example embodiments, the lower stack structure ST1 may include a single lower word line W11 and the upper stack structure ST2 may include a single upper word line W24, the semiconductor device may include a single signal interconnection D1 connected to the decoder XD, a single lower selector SS11 connected to the signal interconnection D1 and further connected to the lower word line W11, and a single upper selector SS21 isolated from direct contact with the single lower selector SS11, connected to the signal interconnection D1, and further connected to the upper word line W24.

In some example embodiments, a first signal interconnection D1 may be connected to a first lower selector SS11 and a first upper selector SS21. The first signal interconnection D1 may be connected to a first lower word line W11 via a corresponding one of the plurality of bonding pads 90, a corresponding one of the plurality of second electrodes 79A, a corresponding one of the plurality of lower selection channel structures 73A, a corresponding one of the plurality of first electrodes 71A, a corresponding one of the plurality of upper contact plugs 64, a corresponding one of the plurality of middle pads 47, and a corresponding one of the plurality of lower contact plugs 43. Further, the first signal interconnection D1 may be connected to a fourth upper word line W24 via a corresponding one of the plurality of bonding pads 90, a corresponding one of the plurality of fourth electrodes 79B, a corresponding one of the plurality of upper selection channel structures 73B, a corresponding one of the plurality of third electrodes 71B, and a corresponding one of the plurality of upper contact plugs 64. The first lower word line W11 may correspond to a lowermost layer of the plurality of lower word lines W11, W12, W13, and W14. The fourth upper word line W24 may correspond to an uppermost layer of the plurality of upper word lines W21, W22, W23, and W24.

A second signal interconnection D2 may be connected to a second lower selector SS12 and a second upper selector SS22. The second signal interconnection D2 may be connected to a second lower word line W12 via the second lower selector SS12. Further, the second signal interconnection D2 may be connected to a third upper word line W23 via the second upper selector SS22. A third signal interconnection D3 may be connected to a third lower selector SS13 and a third upper selector SS23. The third signal interconnection D3 may be connected a third lower word line W13 via the third lower selector SS13. Further, the third signal interconnection D3 may be connected to a second upper word line W22 via the third upper selector SS23.

A fourth signal interconnection D4 may be connected to a fourth lower selector SS14 and a fourth upper selector SS24. The fourth signal interconnection D4 may be connected to a fourth lower word line W14 via the fourth lower selector SS14. Further, the fourth signal interconnection D4 may be connected to a first upper word line W21 via the fourth upper selector SS24. The fourth lower word line W14 may correspond to an uppermost layer of the plurality of lower word lines W11, W12, W13, and W14. The first upper word line W21 may correspond to a lowermost layer of the plurality of upper word lines W21, W22, W23, and W24.

The plurality of lower selectors SS11, SS12, SS13, and SS14 and the plurality of upper selectors SS21, SS22, SS23, and SS24 may be referred to as a stair selector. The plurality of lower selectors SS11, SS12, SS13, and SS14 may be turned on and off due to an electric signal applied to the lower selection line SSG1. The plurality of upper selectors SS21, SS22, SS23, and SS24 may be turned on and off due to an electric signal applied to the upper selection line SSG2. For example, the plurality of lower selectors SS11, SS12, SS13, and SS14 may be turned on due to an electric signal applied to the lower selection line SSG1, and the plurality of upper word lines W21, W22, W23, and W24 may be turned off during operations of the plurality of lower word lines W11, W12, W13, and W14. According to some example embodiments of the inventive concepts, the connection configuration of the plurality of signal interconnections D1, D2, D3, and D4, the plurality of lower selectors SS11, SS12, SS13, and SS14, and the plurality of upper selectors SS21, SS22, SS23, and SS24 may be advantageous in reducing power consumption while reducing or minimizing the number ("quantity") of interconnections.

Figure 15:
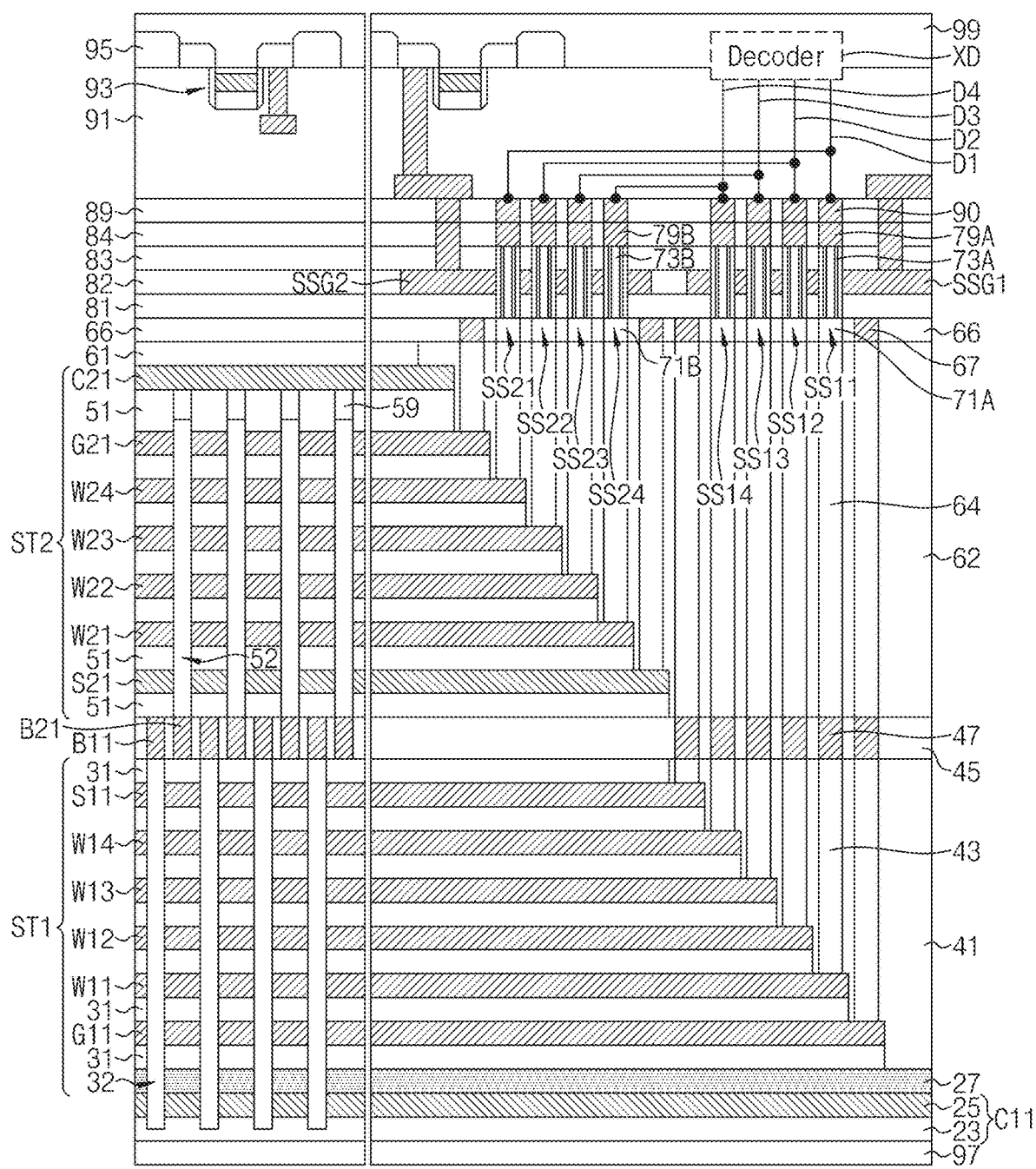
FIGS. 15 and 16 are cross-sectional views illustrating semiconductor devices according to some example embodiments.
Figure 16:
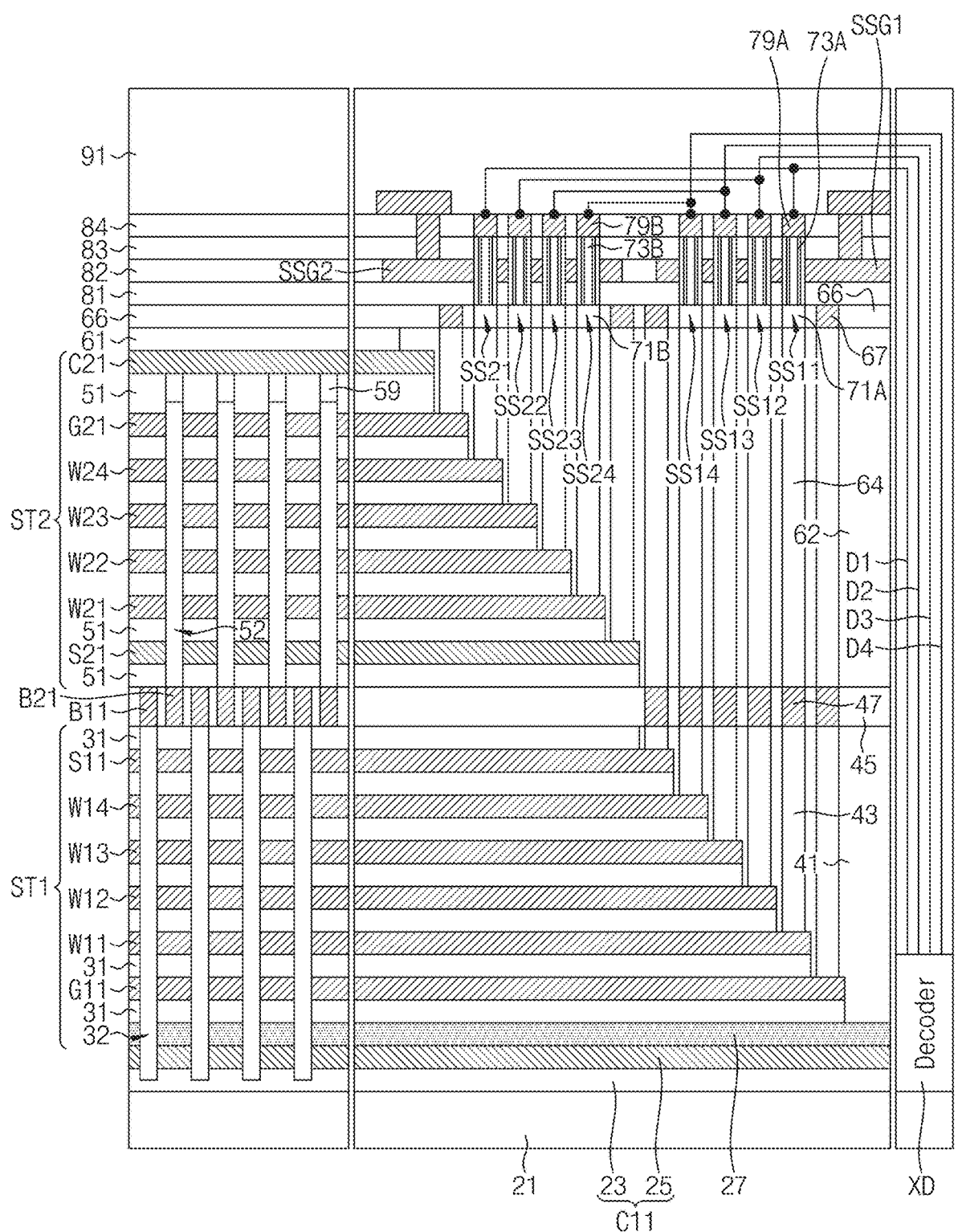

FIGS. 15 and 16 are cross-sectional views illustrating semiconductor devices according to some example embodiments.

Referring to FIG. 15, a semiconductor device according to some example embodiments may include a twelfth insulating layer 97, a buried conductive layer 23, a replacement conductive line 25, a support 27, a plurality of lower insulating layers 31, a lower ground selection line G11, a plurality of lower word lines W11, W12, W13, and W14, a lower string selection line S11, a plurality of lower channel structures 32, a plurality of lower bit lines B11, a first insulating layer 41, a plurality of lower contact plugs 43, a second insulating layer 45, a plurality of middle pads 47, a plurality of upper bit lines B21, a plurality of upper insulating layers 51, an upper string selection line S21, a plurality of upper word lines W21, W22, W23, and W24, an upper ground selection line G21, a plurality of upper channel structures 52, an upper source line C21, a third insulating layer 61, a fourth insulating layer 62, a plurality of upper contact plugs 64, a fifth insulating layer 66, a plurality of upper pads 67, a plurality of first electrodes 71A, a plurality of lower selection channel structures 73A, a plurality of second electrodes 79A, a plurality of third electrodes 71B, a plurality of upper selection channel structures 73B, a plurality of fourth electrodes 79B, a lower selection line SSG1, an upper selection line SSG2, a sixth insulating layer 81, a seventh insulating layer 82, an eighth insulating layer 83, a ninth insulating layer 84, a tenth insulating layer 89, a plurality of bonding pads 90, an eleventh insulating layer 91, a plurality of signal interconnections D1, D2, D3, and D4, a decoder XD, a plurality of transistors 93, a device isolation layer 95, and a second substrate 99.

Referring to FIG. 16, a semiconductor device according to some example embodiments may include a first substrate 21, a buried conductive layer 23, a replacement conductive line 25, a support 27, a plurality of lower insulating layers 31, a lower ground selection line G11, a plurality of lower word lines W11, W12, W13, and W14, a lower string selection line S11, a plurality of lower channel structures 32, a plurality of lower bit lines B11, a first insulating layer 41, a plurality of lower contact plugs 43, a second insulating layer 45, a plurality of middle pads 47, a plurality of upper bit lines B21, a plurality of upper insulating layers 51, an upper string selection line S21, a plurality of upper word lines W21, W22, W23, and W24, an upper ground selection line G21, a plurality of upper channel structures 52, an upper source line C21, a third insulating layer 61, a fourth insulating layer 62, a plurality of upper contact plugs 64, a fifth insulating layer 66, a plurality of upper pads 67, a plurality of first electrodes 71A, a plurality of lower selection channel structures 73A, a plurality of second electrodes 79A, a plurality of third electrodes 71B, a plurality of upper selection channel structures 73B, a plurality of fourth electrodes 79B, a lower selection line SSG1, an upper selection line SSG2, a sixth insulating layer 81, a seventh insulating layer 82, an eighth insulating layer 83, a ninth insulating layer 84, an eleventh insulating layer 91, a plurality of signal interconnections D1, D2, D3, and D4, and a decoder XD.

Figure 17:
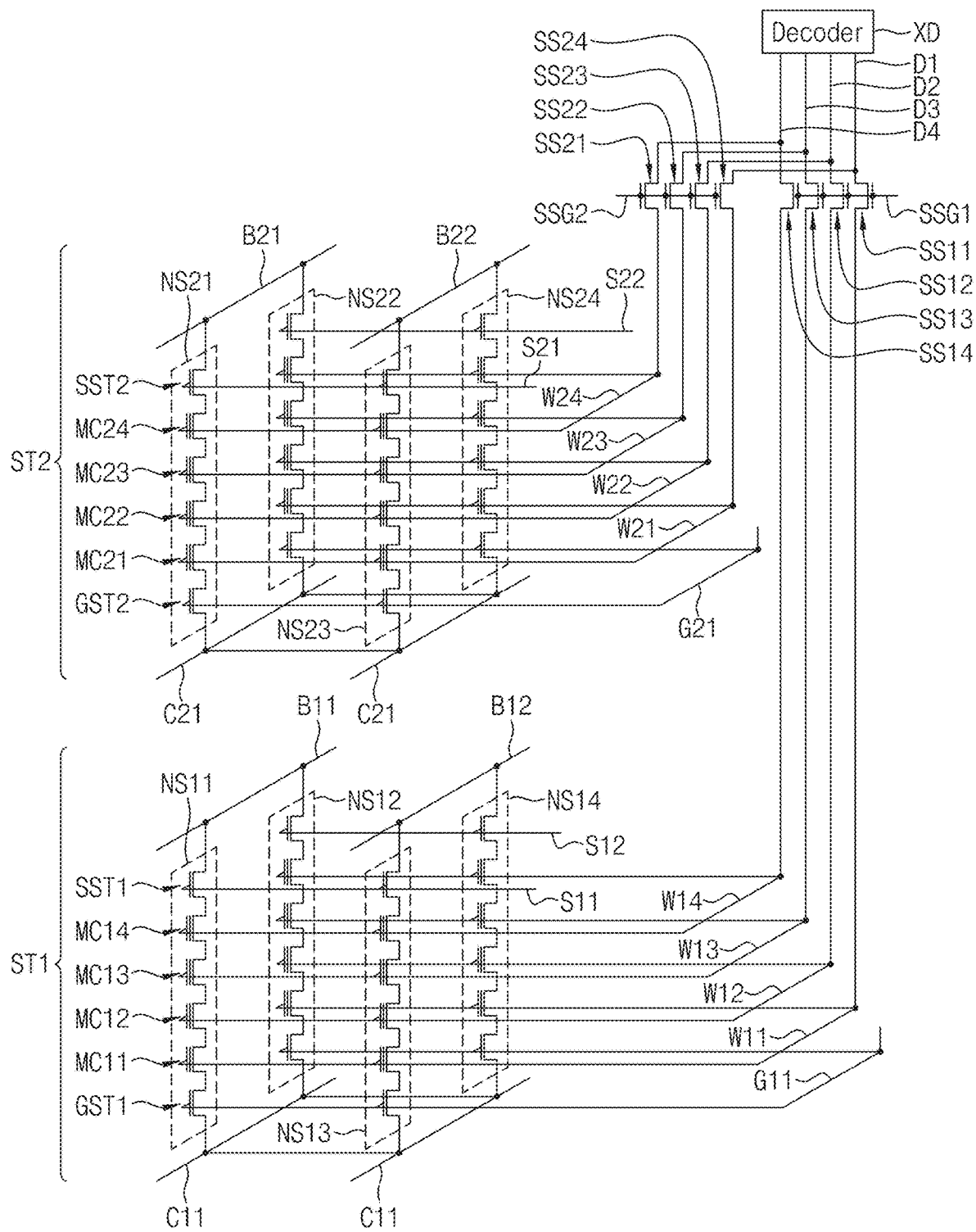
FIG. 17 is a circuit diagram illustrating a semiconductor device according to some example embodiments.

FIG. 17 is a circuit diagram illustrating a semiconductor device according to some example embodiments.

Referring to FIG. 17, the semiconductor device according to some example embodiments may include a lower stack structure ST1, a plurality of lower bit lines B11 and B12, an upper stack structure ST2, a plurality of upper bit lines B21 and B22, a plurality of lower selectors SS11, SS12, SS13, and SS14, a plurality of upper selectors SS21, SS22, SS23, and SS24, and a decoder XD.

The lower stack structure ST1 may include a lower source line C11 and a plurality of lower strings NS11, NS12, NS13, and NS14. Each of the plurality of lower strings NS11, NS12, NS13, and NS14 may include a lower ground selection transistor GST1, a plurality of lower memory cells MC11, MC12, MC13, and MC14, and a lower string selection transistor SST1. The lower ground selection transistor GST1 may be connected to a lower ground selection line G11. Each of the plurality of lower memory cells MC11, MC12, MC13, and MC14 may be connected to a corresponding one of a plurality of lower word lines W11, W12, W13, and W14. The lower string selection transistor SST1 may be connected to a corresponding one of a plurality of lower string selection lines S11 and S12.

The upper stack structure ST2 may include an upper source line C21 and a plurality of upper strings NS21, NS22, NS23, and NS24. Each of the plurality of upper strings NS21, NS22, NS23, and NS24 may include an upper ground selection transistor GST2, a plurality of upper memory cells MC21, MC22, MC23, and MC24, and an upper string selection transistor SST2. The upper ground selection transistor GST2 may be connected to an upper ground selection line G21. Each of the plurality of upper memory cells MC21, MC22, MC23, and MC24 may be connected to a corresponding one of a plurality of upper word lines W21, W22, W23, and W24. The upper string selection transistor SST2 may be connected to a corresponding one of a plurality of upper string selection lines S21 and S22.

Each of the plurality of lower selectors SS11, SS12, SS13, and SS14 may be connected to a corresponding one of a plurality of signal interconnections D1, D2, D3, and D4. Each of the plurality of lower selectors SS11, SS12, SS13, and SS14 may be connected to a corresponding one of the plurality of lower word lines W11, W12, W13, and W14. The plurality of lower selectors SS11, SS12, SS13, and SS14 may include a lower selection line SSG1. Each of the plurality of upper selectors SS21, SS22, SS23, and SS24 may be connected to a corresponding one of the plurality of signal interconnections D1, D2, D3, and D4. Each of the plurality of upper selectors SS21, SS22, SS23, and SS24 may be connected to a corresponding one of the plurality of upper word lines W21, W22, W23, and W24. The plurality of upper selectors SS21, SS22, SS23, and SS24 may include an upper selection line SSG2.

FIGS. 18, 19, 20, 21, and 22 are cross-sectional views illustrating a method of forming a semiconductor device according to some example embodiments.

Figure 18:
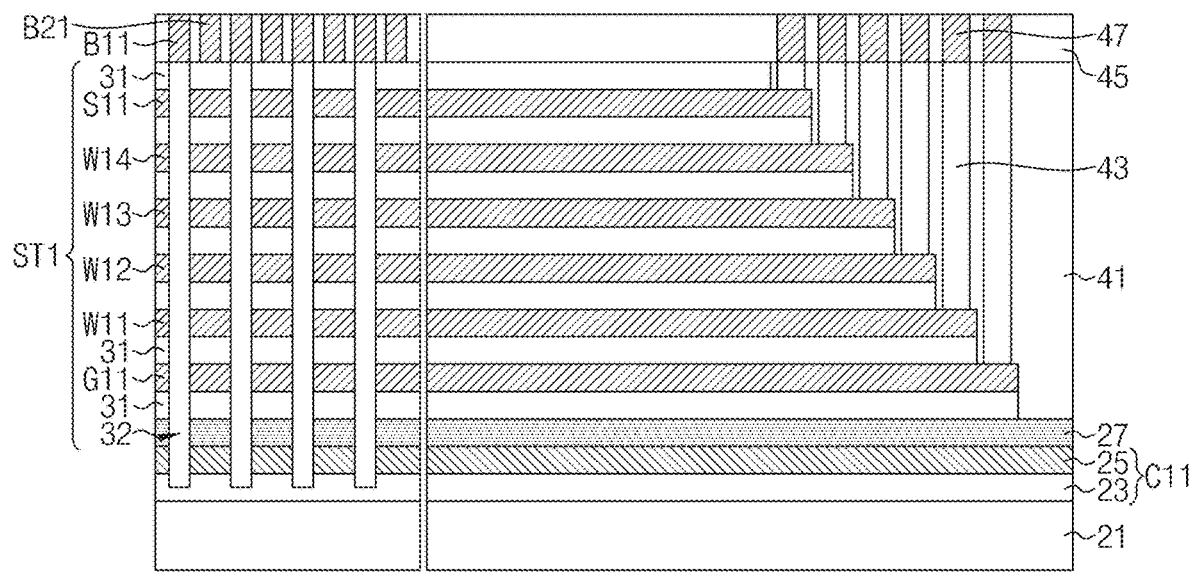
FIGS. 18, 19, 20, 21, and 22 are cross-sectional views illustrating a method of forming a semiconductor device according to some example embodiments.

Referring to FIG. 18, a buried conductive layer 23, a replacement conductive line 25, a support 27, a plurality of lower insulating layers 31, a lower ground selection line G11, a plurality of lower word lines W11, W12, W13, and W14, a lower string selection line S11, a plurality of lower channel structures 32, a plurality of lower bit lines B11, a first insulating layer 41, a plurality of lower contact plugs 43, a second insulating layer 45, a plurality of middle pads 47, and a plurality of upper bit lines B21 may be formed on a first substrate 21.

The first substrate 21 may include a semiconductor substrate such as a silicon wafer. The buried conductive layer 23 may be formed by implanting N-type impurities into the first substrate 21. The replacement conductive line 25 may include a conductive layer including a metal, a metal nitride, a metal oxide, a metal silicide, polysilicon, or a combination thereof. The support 27 may include a polysilicon layer. Each of the lower ground selection line G11, the plurality of lower word lines W11, W12, W13, and W14, the lower string selection line S11, the plurality of lower bit lines B11, the plurality of lower contact plugs 43, the plurality of middle pads 47, and the plurality of upper bit lines B21 may include a conductive layer including a metal, a metal nitride, a metal oxide, a metal silicide, conductive carbon, polysilicon, or a combination thereof. The plurality of lower channel structures 32 may include a configuration similar to those described with reference to FIGS. 2, 10, 12, and 14. Each of the plurality of lower insulating layers 31, the first insulating layer 41, and the second insulating layer 45 may include an insulating layer including silicon oxide, silicon nitride, silicon oxynitride, a high-k dielectric, a low-k dielectric, or a combination thereof.

Figure 19:
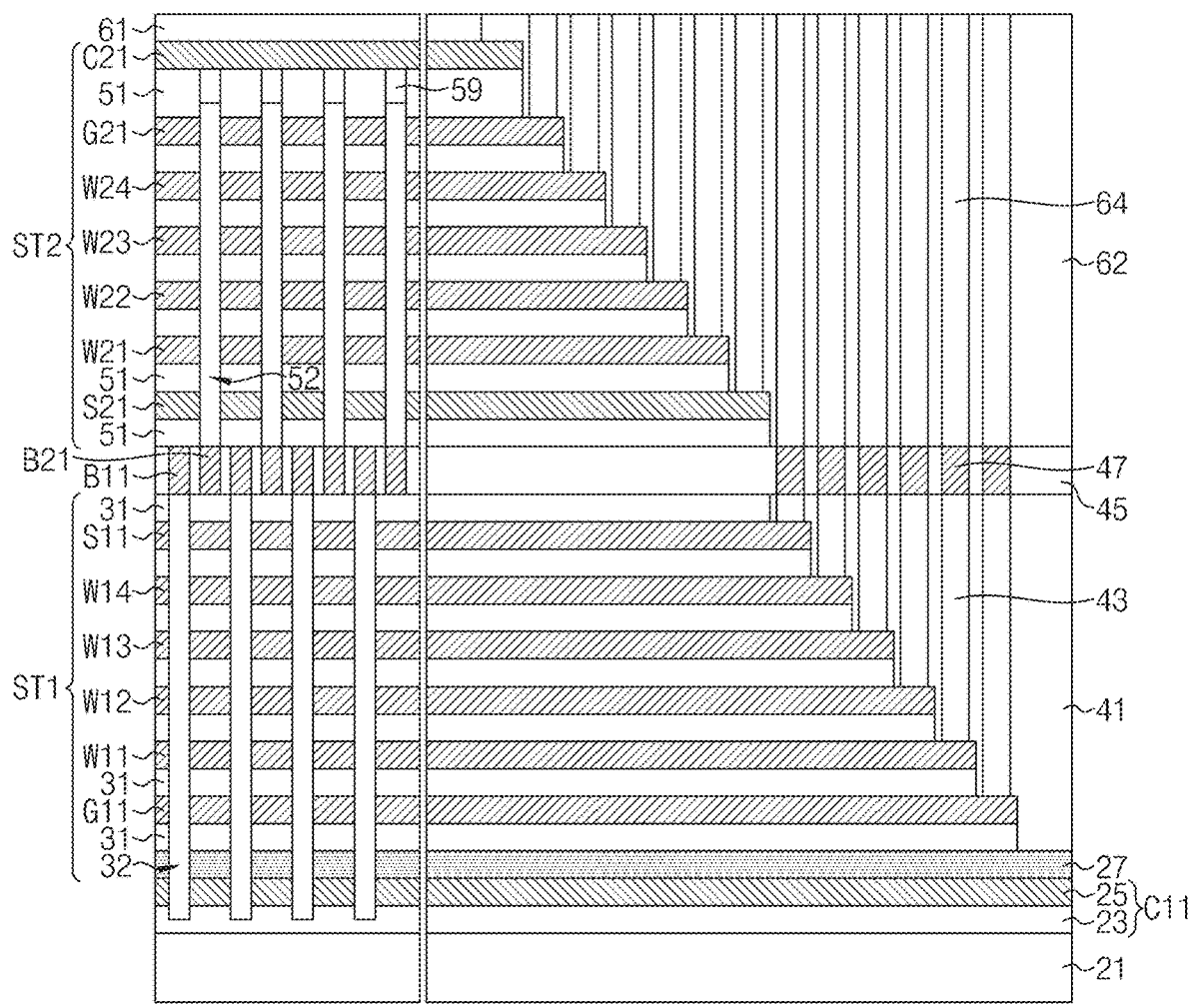

Referring to FIG. 19, a plurality of upper insulating layers 51, an upper string selection line S21, a plurality of upper word lines W21, W22, W23, and W24, an upper ground selection line G21, a plurality of upper channel structures 52, an upper source line C21, a third insulating layer 61, a fourth insulating layer 62, and a plurality of upper contact plugs 64 may be formed on the plurality of lower bit lines B11, the plurality of upper bit lines B21, the plurality of middle pads 47, and the second insulating layer 45. Each of the plurality of upper channel structures 52 may include an upper source pad 59.

Each of the upper string selection line S21, the plurality of upper word lines W21, W22, W23, and W24, the upper ground selection line G21, the upper source line C21, and the plurality of upper contact plugs 64 may include a metal, a metal nitride, a metal oxide, a metal silicide, conductive carbon, polysilicon, or a combination thereof. Each of the plurality of upper channel structures 52 may include a configuration similar to those described with reference to FIGS. 2, 11, and 13. The upper source pad 59 may include a polysilicon layer containing N-type impurities. The upper source pad 59 may serve as a source or drain. Each of the plurality of upper insulating layers 51, the third insulating layer 61, and the fourth insulating layer 62 may include an insulating layer including silicon oxide, silicon nitride, silicon oxynitride, a high-k dielectric, a low-k dielectric, or a combination thereof.

Figure 20:
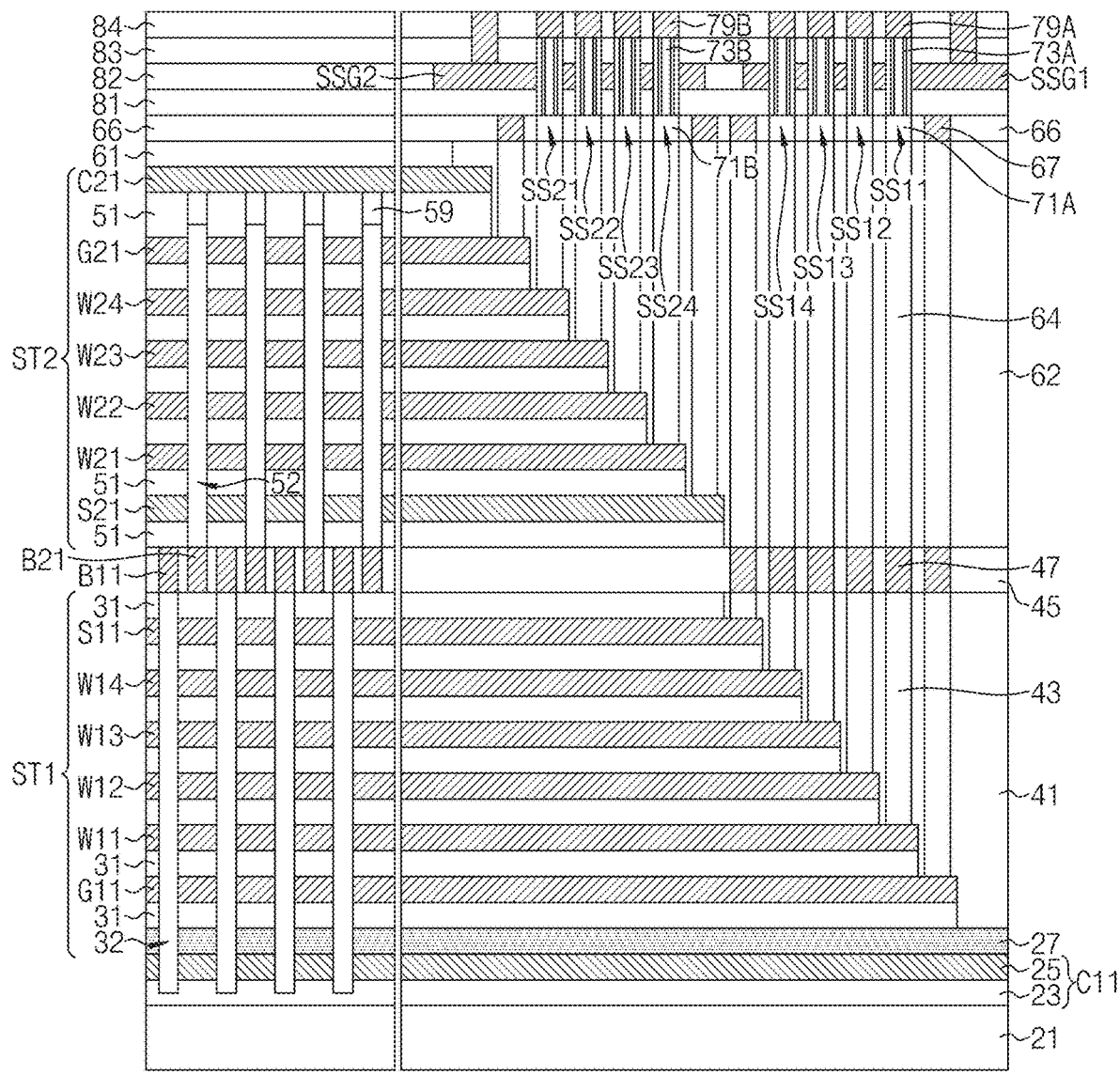

Referring to FIG. 20, a fifth insulating layer 66, a plurality of upper pads 67, a plurality of first electrodes 71A, a plurality of lower selection channel structures 73A, a plurality of second electrodes 79A, a plurality of third electrodes 71B, a plurality of upper selection channel structures 73B, a plurality of fourth electrodes 79B, a lower selection line SSG1, an upper selection line SSG2, a sixth insulating layer 81, a seventh insulating layer 82, an eighth insulating layer 83, and a ninth insulating layer 84 may be formed on the third insulating layer 61, the fourth insulating layer 62, and the plurality of upper contact plugs 64.

The plurality of first electrodes 71A, the plurality of lower selection channel structures 73A, the plurality of second electrodes 79A, the plurality of third electrodes 71B, the plurality of upper selection channel structures 73B, and the plurality of fourth electrodes 79B may include configurations similar to those described with reference to FIGS. 2 to 9. Each of the plurality of upper pads 67, the lower selection line SSG1, and the upper selection line SSG2 may include a conductive layer including a metal, a metal nitride, a metal oxide, a metal silicide, conductive carbon, polysilicon, or a combination thereof. Each of the fifth insulating layer 66, the sixth insulating layer 81, the seventh insulating layer 82, the eighth insulating layer 83, and the ninth insulating layer 84 may include an insulating layer including silicon oxide, silicon nitride, silicon oxynitride, a high-k dielectric, a low-k dielectric, or a combination thereof.

Figure 21:
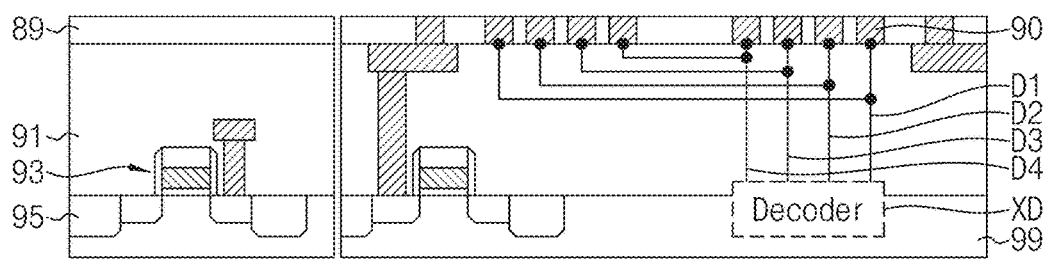

Referring to FIG. 21, a plurality of transistors 93, a device isolation layer 95, a decoder XD, an eleventh insulating layer 91, a plurality of signal interconnections D1, D2, D3, and D4, a tenth insulating layer 89, and a plurality of bonding pads 90 may be formed on a second substrate 99.

The second substrate 99 may include a semiconductor substrate such as a silicon wafer. Each of the plurality of signal interconnections D1, D2, D3, and D4 and the plurality of bonding pads 90 may include a conductive layer including a metal, a metal nitride, a metal oxide, a metal silicide, conductive carbon, polysilicon, or a combination thereof. Each of the device isolation layer 95, the tenth insulating layer 89, and the eleventh insulating layer 91 may include an insulating layer including silicon oxide, silicon nitride, silicon oxynitride, a high-k dielectric, a low-k dielectric, or a combination thereof.

Figure 22:
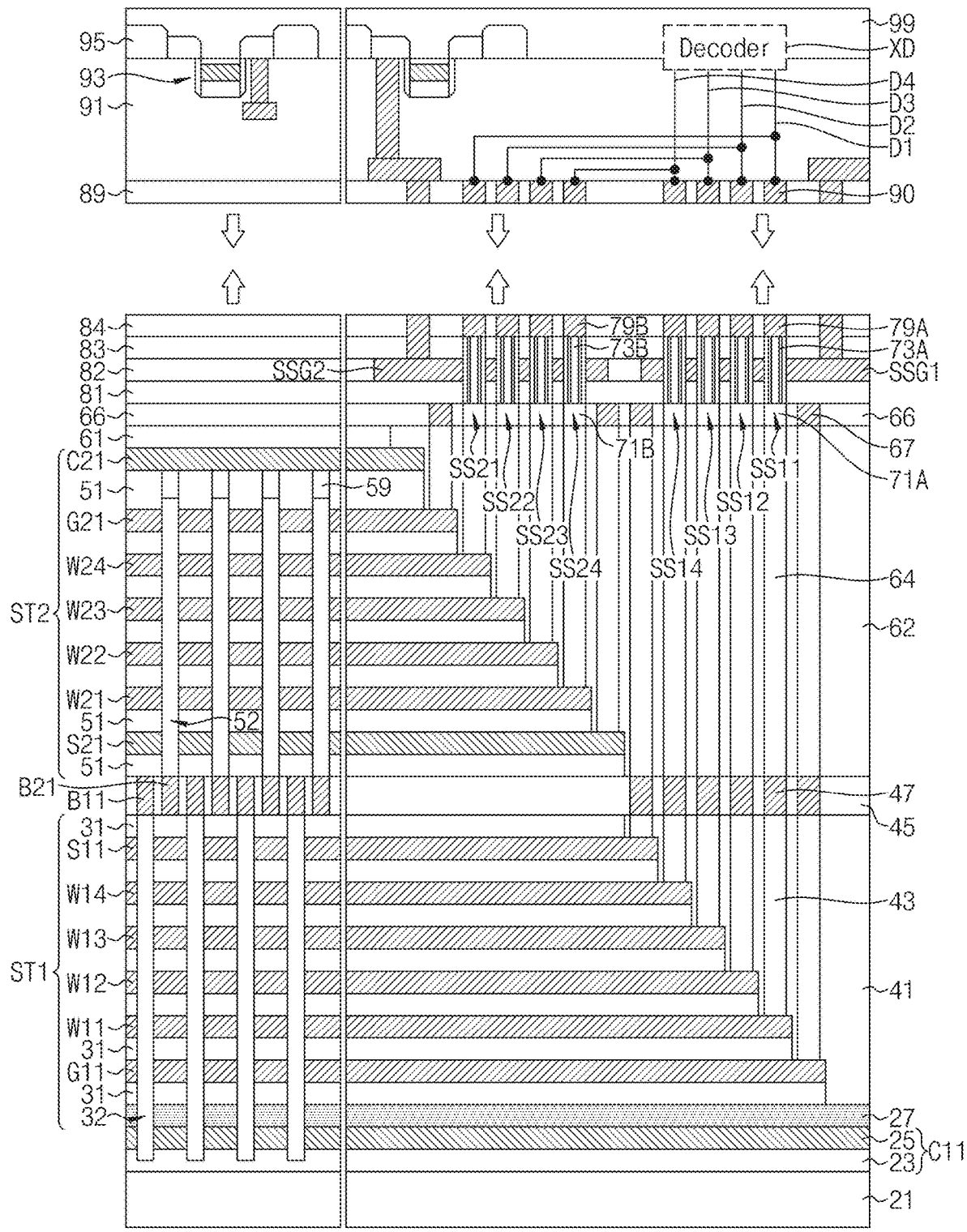

Referring to FIG. 22, the second substrate 99 may be bonded to the first substrate 21. The ninth insulating layer 84, the plurality of second electrodes 79A, and the plurality of fourth electrodes 79B may be bonded to the tenth insulating layer 89 and the plurality of bonding pads 90. Each of the plurality of bonding pads 90 may be connected to a corresponding one of the plurality of second electrodes 79A and the plurality of fourth electrodes 79B.

According to some example embodiments of the inventive concepts, a plurality of signal interconnections, a plurality of lower selectors, and a plurality of upper selectors are provided. The connection configuration of the plurality of lower selectors and the plurality of upper selectors may be advantageous in reducing power consumption while reducing or minimizing the number ("quantity") of interconnections. A semiconductor device that is advantageous for a high integration density and low power consumption can be implemented.

While the embodiments of the inventive concepts have been described with reference to the accompanying drawings, it should be understood by those skilled in the art to which the inventive concepts pertains that various modifications may be made without departing from the scope of the inventive concepts and without changing essential features thereof. Therefore, the above-described embodiments should be considered in a descriptive sense only and not for purposes of limitation.

What is claimed is:

1. A semiconductor device, comprising:
   a first stack structure including an alternating stack of a plurality of first word lines and a plurality of first insulating layers;
   a plurality of first channel structures extending through the first stack structure;
   a second stack structure on the first stack structure, the second stack structure including an alternating stack of a plurality of second word lines and a plurality of second insulating layers;
   a plurality of second channel structures extending through the second stack structure, each of the plurality of second channel structures being offset from each of the plurality of first channel structures;
   a plurality of first selectors connected to the plurality of first word lines;
   a plurality of second selectors connected to the plurality of second word lines;
   a plurality of first conductive pads disposed on the second stack structure, each of the plurality of first conductive pads being connected to a corresponding one of the plurality of first selectors and the plurality of second selectors;
   a plurality of second conductive pads disposed on the plurality of first conductive pads, each of the plurality of second conductive pads being in direct contact with a corresponding one of the plurality of first conductive pads; and
   a decoder disposed on the plurality of second conductive pads and connected to the plurality of second conductive pads.

2. The semiconductor device of claim 1, further comprising:
   a plurality of first bit lines connected to separate, respective first channel structures of the plurality of first channel structures; and
   a plurality of second bit lines connected to separate, respective second channel structures of the plurality of second channel structures.

3. The semiconductor device of claim 2, wherein the plurality of first bit lines and the plurality of second bit lines are adjacent to each other between the first stack structure and the second stack structure.

4. The semiconductor device of claim 3, wherein the plurality of second bit lines are isolated from direct contact with the plurality of first bit lines.

5. The semiconductor device of claim 2, further comprising:
   a plurality of lower string selection lines between the plurality of first bit lines and the plurality of first word lines.

6. The semiconductor device of claim 2, further comprising:
   a plurality of upper string selection lines between the plurality of second bit lines and the plurality of second word lines.

7. The semiconductor device of claim 2, further comprising:
   an upper ground selection line on the plurality of second word lines.

8. The semiconductor device of claim 2, further comprising:
   a plurality of lower contact plugs connected to the plurality of first word lines;
   a plurality of middle pads on the plurality of lower contact plugs; and
   a plurality of upper contact plugs disposed on the plurality of middle pads and connected to the plurality of first selectors.

9. The semiconductor device of claim 8, wherein top surfaces of the plurality of middle pads, the plurality of first bit lines and the plurality of second bit lines are substantially coplanar.

10. The semiconductor device of claim 1, further comprising:
    a third insulating layer on the plurality of first selectors and the plurality of second selectors, the plurality of first conductive pads being disposed in the third insulating layer; and
    a fourth insulating layer on the third insulating layer, the plurality of second conductive pads being disposed in the fourth insulating layer,
    wherein the fourth insulating layer being in direct contact with the third insulating layer.

11. The semiconductor device of claim 1, wherein each of the plurality of first selectors and the plurality of second selectors includes one or more transistors.

12. The semiconductor device of claim 1, further comprising:
    a plurality of signal interconnections connected between the decoder and the plurality of second conductive pads,
    wherein each of the plurality of signal interconnections is connected to
      a separate, respective first selector of the plurality of first selectors via a corresponding one of the plurality of second conductive pads and a corresponding one of the plurality of first conductive pads, and
      a separate, respective second selector of the plurality of second selectors via a corresponding one of the plurality of second conductive pads and a corresponding one of the plurality of first conductive pads.

13. The semiconductor device of claim 12, wherein each of the plurality of signal interconnections is connected to
    a separate, respective first word line of the plurality of first word lines via the separate, respective first selector of the plurality of first selectors, and
    a separate, respective second word line of the plurality of second word lines via the separate, respective second selector of the plurality of second selectors.

14. The semiconductor device of claim 1, wherein
    the plurality of first selectors includes
      a lower selection line,
      a plurality of lower selection channel structures disposed adjacent to the lower selection line, and
      a plurality of first electrodes between the plurality of lower selection channel structures and the plurality of first word lines, and
    the plurality of second selectors includes
      an upper selection line isolated from direct contact with the lower selection line,
      a plurality of upper selection channel structures adjacent to the upper selection line, and
      a plurality of second electrodes between the plurality of upper selection channel structures and the plurality of second word lines, and each of the plurality of lower selection channel structures and the plurality of upper selection channel structures being connected to a corresponding one of the plurality of first conductive pads.

15. The semiconductor device of claim 14, wherein the upper selection line and the lower selection line are coplanar with each other.

16. The semiconductor device of claim 14, wherein
each lower selection channel structure of the plurality of lower selection channel structures extends through the lower selection line, and
each upper selection channel structure of the plurality of upper selection channel structures extends through the upper selection line.

17. The semiconductor device of claim 16, wherein each selection channel structure of the plurality of lower selection channel structures and the plurality of upper selection channel structures includes
a channel layer; and
a gate dielectric layer configured to surround an outer longitudinal surface of the channel layer.

18. The semiconductor device of claim 17, wherein
the channel layer is connected to the plurality of first electrodes and the plurality of first conductive pads, or
the channel layer is connected to the plurality of second electrodes and the plurality of first conductive pads.

19. A semiconductor device, comprising:
a first stack structure including an alternating stack of a plurality of first word lines and a plurality of first insulating layers;
a plurality of first channel structures extending through the first stack structure;
a second stack structure on the first stack structure, the second stack structure including an alternating stack of a plurality of second word lines and a plurality of second insulating layers;
a plurality of second channel structures extending through the second stack structure, each of the plurality of second channel structures being offset from each of the plurality of first channel structures;
a plurality of first selectors connected to the plurality of first word lines;
a plurality of second selectors connected to the plurality of second word lines;
a third insulating layer on the plurality of first selectors and the plurality of second selectors;
a plurality of first conductive pads in the third insulating layer, each of the plurality of first conductive pads being connected to a corresponding one of the plurality of first selectors and the plurality of second selectors;
a fourth insulating layer directly on the third insulating layer;
a plurality of second conductive pads in the fourth insulating layer, each of the plurality of second conductive pads being in direct contact with a corresponding one of the plurality of first conductive pads; and
a decoder disposed on the fourth insulating layer and connected to the plurality of second conductive pads.

20. A semiconductor device, comprising:
a lower stack structure including a lower word line;
a lower channel structure extending through the lower stack structure;
an upper stack structure on the lower stack structure, the upper stack structure including an upper word line;
an upper channel structure extending through the upper stack structure, the upper channel structure being offset from the lower channel structure;
a decoder adjacent to the lower stack structure and the upper stack structure;
a lower selector connected to the decoder and connected to the lower word line; and
an upper selector connected to the decoder, isolated from direct contact with the lower selector, and further connected to the upper word line,
wherein each of the lower selector and the upper selector includes one or more transistors.

* * * * *